United States Patent [19]

Ichikawa et al.

[11] Patent Number: 5,466,631
[45] Date of Patent: Nov. 14, 1995

[54] METHOD FOR PRODUCING SEMICONDUCTOR ARTICLES

[75] Inventors: Takeshi Ichikawa, Zama; Takao Yonehara; Masaru Sakamoto, both of Atsugi; Yasuhiro Naruse, Aiko; Jun Nakayama, Atsugi; Kenji Yamagata, Kawasaki; Kiyofumi Sakaguchi, Atsugi, all of Japan

[73] Assignee: Canon Kabushiki Kaisha, Tokyo, Japan

[21] Appl. No.: 392,685

[22] Filed: Feb. 23, 1995

Related U.S. Application Data

[63] Continuation of Ser. No. 959,105, Oct. 9, 1992, abandoned.

[30] Foreign Application Priority Data

| Oct. 11, 1991 | [JP] | Japan | 3-292255 |
| Oct. 11, 1991 | [JP] | Japan | 3-292256 |
| Nov. 25, 1991 | [JP] | Japan | 3-334574 |
| Jan. 28, 1992 | [JP] | Japan | 4-035732 |
| Jan. 31, 1992 | [JP] | Japan | 4-041951 |
| Jan. 31, 1992 | [JP] | Japan | 4-046301 |

[51] Int. Cl.$^6$ ............................................. H01L 21/76
[52] U.S. Cl. ...................... 437/62; 437/966; 437/170; 148/DIG. 12
[58] Field of Search .................. 437/62, 170, 966; 148/DIG. 12, DIG. 85, DIG. 86

[56] References Cited

U.S. PATENT DOCUMENTS

| 3,756,877 | 9/1973 | Muraoka et al. | 156/17 |
| 3,962,052 | 6/1976 | Abbas | 204/129.3 |
| 3,997,381 | 12/1976 | Wanlass | 156/3 |
| 4,142,925 | 3/1979 | King et al. | 148/175 |
| 4,171,242 | 10/1979 | Liu | 156/657 |
| 4,177,094 | 12/1979 | Kroon | 148/175 |
| 4,198,263 | 4/1980 | Matsuda | 156/639 |
| 4,380,865 | 4/1983 | Frye et al. | 29/576 W |
| 4,771,016 | 9/1988 | Bajor et al. | 437/180 |
| 4,806,996 | 2/1989 | Luryi | 357/16 |
| 4,878,957 | 11/1989 | Yamaguchi et al. | 148/33.3 |
| 4,891,329 | 1/1990 | Reisman et al. | 437/61 |
| 4,897,362 | 1/1990 | Delgado | 437/26 |
| 4,939,101 | 7/1990 | Black et al. | 437/62 |

(List continued on next page.)

FOREIGN PATENT DOCUMENTS

| 0312466 | 4/1989 | European Pat. Off. . |
| 0499488 | 8/1992 | European Pat. Off. . |
| 53-45675 | 12/1978 | Japan . |
| 55-16464 | 2/1980 | Japan . |
| 61-183940 | 8/1986 | Japan | H01L 21/76 |
| 63-237408 | 10/1988 | Japan . |
| 2267949 | 11/1990 | Japan . |
| 3109731 | 5/1991 | Japan . |
| 4-79209 | 3/1992 | Japan . |
| WO9109420 | 6/1991 | WIPO . |

OTHER PUBLICATIONS

Journal of the Electrochemical Society, Mar. 1984, vol. 131, No. 3, L. Liou et al., "Amorphous Silicon Produced by Ion Implantation."

(List continued on next page.)

Primary Examiner—George Fourson
Attorney, Agent, or Firm—Fitzpatrick, Cella, Harper & Scinto

[57] ABSTRACT

A method for producing a semiconductor article comprises the steps of preparing a first substrate having a non-porous semiconductor layer on a porous semiconductor region, forming unevenness on the surface at the side of said semiconductor layer of said first substrate; bonding the surface of said first substrate having said unevenness formed thereon to the surface of said second substrate so as to be in contact with each other, and removing said porous semiconductor under the state that said semiconductor layer is bonded to said second substrate to thereby transfer said semiconductor layer from said first substrate onto said second substrate.

52 Claims, 20 Drawing Sheets

U.S. PATENT DOCUMENTS

| | | | |
|---|---|---|---|
| 4,962,051 | 10/1990 | Liaw | 437/26 |
| 5,013,681 | 5/1991 | Godbey et al. | 437/86 |
| 5,091,330 | 2/1992 | Cambou et al. | |
| 5,110,748 | 5/1992 | Sarma et al. | 437/51 |
| 5,204,282 | 4/1993 | Tsuruta et al. | |

OTHER PUBLICATIONS

Electrochemical Society: Solid State Science, Apr. 1967, S. M. Hu et al., "Observation of Etching of n–Type Silicon in aqueous HF Solutions."

Journal of Applied Physics, vol. 60, No. 1, Jul. 1986, H. Takai et al., "Porous Silicon Layers and its Oxide for the Silicon–on–Insulator Structure."

Applied Physics Letters, Oct. 1986, vol. 49, pp. 1104–1106, T. L. Lin, et al., "New Silicon–on–Insulator Technology Using a Two–Step Oxidation Technique."

Japanese Journal of Applied Physics, vol. 16, No. 5, May 1977, N. Tsubouchi et al., "Oxidation of Silicon in High–Pressure Steam."

IBM Technical Disclosure Bulletin, vol. 27, No. 8, Jan. 1985, L. A. Nesbit, "Defect–Free Silicon on Insulator by Oxidized Porous Silicon."

Japanese Journal of Applied Physics, vol. 23, No. 10, pp. L815–L817, Oct. 1984, "Device Layer Transfer Technique Using Chemi–Mechanical Polishing", T. Hamaguchi et al.

IBM Technical Disclosure Bulletin, vol. 14, No. 11, Apr. 1972, G. H. Schwuttke et al., "Etching of Vertical Walled Patterns in (100) Silicon."

Applied Physics Letters, 49, pp. 716–718, Sep. 1986, J. D. Benjamin et al., "Large Area, Uniform Silicon–on–Insulator Using a Buried Layer of Oxidized Porous Silicon."

Applied Physics Letters, 49, No. 10, Sep. 1990, L. T. Canham, "Silicon Quantum Wire Array Fabrication by Electrochemical and Chemical Dissolution of Wafers."

Journal of the Electrochemical Society, vol. 130, No. 7, Jul. 1983, G. Bomchil et al., "Pore Size Distribution in Porous Silicon Studied by Adsorption Isotherms."

Solid State Electronics, vol. 24, pp. 159–164, Mar. 1980, Kazuo Imai, "A New dielectric Isolation Method Using Porous Silicon."

The Bell System Technical Journal, vol. 35, pp. 333–347, 1956, A. Uhlir, Jr., "Electrolytic Shaping of Germanium and Silicon."

Materials Letters, vol. 7, No. 3, Sep. 1988, L. Vescan et al., "Low–Pressure Vapor–Phase Epitaxy of Silicon on Porous Silicon."

Journal of Crystal Growth, vol. 63, No. 3, Oct. 1983, "Single–Crystal Silicon on Non–Single–Crystal Insulators."

Journal of the Electrochemical Society, vol. 127, No. 2, Feb. 1980, Takashi Unagami, "Formation Mechanism of Porous Silicon Layer by Anodization in HF Solution."

Japanese Journal of Applied Physics, vol. 28, No. 8, 1989, J. Haisma et al., "Silicon–on–Insulator Wafer Bonding–Wafer Thinning Technological Evaluations."

Microelectronic Engineering, vol. 8, 293–310, (1988), G. Bomchil et al., "Porous Silicon: The Material and its Applications to SOI Technologies".

Solid–State Electronics, vol. 24, pp. 159–164 (1981), Kazuo Imai, "A New Dielectric Isolation Method Using Porous Silicon."

Journal of the Electrochemical Society, vol. 130, No. 7, pp. 1612–1614, Jul. 1983, G. Bomchil et al., "Pore Size Distribution in Porous Silicon Studied by Adsorption Isotherms." 1983.

The Bell System Technical Journal, vol. 35, pp. 333–347, (1956), A. Uhlir, Jr., "Electrolytic Shaping of Germanium and Silicon."

Journal of the Electrochemical Society, vol. 127, No. 2, pp. 476–483, 1980 Feb. 1980, T. Unagami, "Formation Mechanism of Porous Silicon Layer by Anodization in HF Solution."

Journal of Crystal Growth, vol. 63, No. 3, pp. 547–553, Oct. 11, 1983, S. Imai et al., "Crystalline Quality of Silicon layer Formed by Fipos Technology."

METHOD FOR PRODUCING SEMICONDUCTOR ARTICLES

This application is a continuation of application Ser. No. 07/959,105 filed Oct. 9, 1992, now abandoned.

BACKGROUND OF THE INVENTION

1. Field of the Invention

The present invention relates to a method for producing a semiconductor article for forming semiconductor devices such as integrated circuits, semiconductor lasers, and light emitting diodes, and more particularly to a semiconductor article production method including a step of transferring a semiconductor layer formed on a substrate to the surface of another substrate.

2. Related Background Art

The term "semiconductor article" is used herein to refer to a semiconductor wafer, a semiconductor substrate, a semiconductor substrate material, a semiconductor device, and the like. Not only those having semiconductor devices formed in their semiconductor regions, but also those which are prepared before device fabrication and have no devices are included in what this term implies.

Among such various semiconductor articles, some semiconductor articles include a semiconductor layer on an insulating material. Formation of a monocrystalline silicon (Si) semiconductor layer on an insulating material has been widely known as the silicon on insulator (SOI) technology. Those devices utilizing the SOI structure exhibit a large number of advantages which cannot be achieved by devices made simply on bulk silicon substrates, for preparation of the conventional silicon integrated circuits. Therefore, many investigations have been made. More specifically, by utilizing the SOI structure, the following advantages can be obtained:

1. Dielectric isolation can be easily made to enable high degree of integration;
2. Radiation hardness is excellent;
3. Stray capacitance can be reduced to attain high-speed operation of devices;
4. Well formation step can be omitted;
5. Latch-up can be prevented; and
6. Fully depleted field effect transistors can be achieved by thin film formation.

In order to realize the many advantages in device characteristics as mentioned above, studies have been made about the method for forming the SOI structure for some 10 years.

For example, one typical technology is SOS (silicon on sapphire) structure by heteroepitaxy of silicon on a monocrystalline sapphire substrate by CVD (chemical vapor deposition) method. Although this has been successful to some extent as the most mature SOI technique, there are still many problems to be solved to apply this technology in wide applications. For examples, there area large amount of crystal defects because of lattice mismatching at the interface between the silicon layer and the sapphire substrate. Another problem is introduction of aluminum from the sapphire substrate into the silicon layer. Furthermore, the most significant problems are the high cost of the substrate and delay in availability of large size of substrate wafers. In relatively recent years, it has been attempted to realize the SOI structure without use of a sapphire substrate. Such attempts may be classified into the following two methods:

(1) After surface oxidation of a monocrystalline silicon substrate, a window is formed to partially expose the silicon substrate, and epitaxial growth is carried out in the lateral direction using the exposed portion of silicon as a seed to form a monocrystalline silicon layer on $SiO_2$ (In this case, deposition of silicon layer on $SiO_2$ is accompanied.)

(2) By use of a monocrystalline silicon substrate itself as an active layer, $SiO_2$ is formed therebeneath. (This method is accompanied with no deposition of silicon layer.)

As a means for realizing the above (1), there have been known the method in which a monocrystalline silicon layer is formed directly by gas phase lateral epitaxial growth by CVD, the method in which amorphous silicon is deposited and the resultant amorphous layer is subjected to solid phase lateral epitaxial growth by heat treatment, the method in which a deposited layer of amorphous or polycrystalline silicon is irradiated with an energy of focused beam such as electron beam, laser beam, etc., to melt and recrystallize them into a monocrystalline layer on $SiO_2$ and the method in which a zone of amorphous layer is by a rod-shaped heater and the melted region is scanned (Zone melting recrystallization). These methods have both advantages and disadvantages, they still have many problems with respect to controllability, productivity, uniformity and quality, and none of them have been industrially applied yet to date. For example, the CVD method requires sacrifice-oxidation for flat thin film formation, while the crystallinity is poor in the solid phase growth method. On the other hand, in the beam annealing method, problems are involved in controllability of such as treatment time by converged beam scanning, overlapping of beams, focus adjustment, etc. Among these, the Zone Melting Recrystallization method is the most mature, and a relatively large scale integrated circuit has been made experimentally, but there still remain a large number of crystal defects such as point defects, line defects, plane defects (sub-boundary), etc., and no device operating with minority carriers has been realized yet.

Concerning the method using no silicon substrate as a seed for epitaxial growth according to the above method (2), the following three methods may be included.

(2-1) An oxide; film is formed on a monocrystalline silicon substrate with V-grooves as anisotropically etched on the surface, then a polycrystalline silicon layer is deposited on the oxide film to the thickness extent as the silicon substrate, and thereafter by polishing the silicon substrate from the back side, the monocrystalline silicon regions dielectrically separated by the surrounding V-grooves on the thick polycrystalline silicon layer are formed.

In this method, although crystallinity is good, there are problems with respect to controllability and productivity in the step of depositing polycrystalline silicon some hundred microns in thickness and in the step wherein the monocrystalline silicon substrate is polished from the back surface so that only the silicon active layer remains as separated.

(2-2) There is the method called SIMOX (Separation by ion-implanted oxygen) in which an $SiO_2$ layer is formed inside a monocrystalline silicon substrate by implanting oxygen atoms into the monocrystalline silicon substrate, which is one of the most mature methods because of good matching with the Si-IC (Integrated Circuit) process.

However, for formation of the $SiO_2$ layer, $10^{18}$ ions/cm$^2$ or more of oxygen ions are required to be implanted, and the implantation time is too long to be good in productivity, and the wafer cost is also high. Further, from an industrial point of view, sufficiently good quality has not been achieved to fabricate a device operating with minority carriers, because many crystal defects remain.

(2-3) There is the method to form an SOI structure by dielectric isolation according to oxidation of porous silicon. In this method, islands of n-type silicon layer are formed on the surface of a p-type monocrystalline silicon substrate by way of proton ion implantation (Imai et al., J. Crystal Growth, Vol. 63, 547 (1983)), or by epitaxial growth in conjunction with patterning. Then, only the p-type silicon substrate is made porous by anodization in HF solution surrounding the silicon islands from the surface. Thus, the n-type silicon islands are dielectrically isolated by accelerated oxidation.

In this method, the possible size of separated silicon regions is limited to the range from several microns to several hundred microns. This limitation results in significant problems in device fabrication process and design. Besides, there remains large stress in the silicon islands which leads to a large number of crystal defects.

Furthermore, there are some problems in the process for removing the porous layers by chemical etching, which is inevitable for the method (2-3) described above.

In general, porosity is defined by:

$$P=(2.33-A)/2.33 \quad (1)$$

This value of porosity can be changed during the anodization. The porosity can be also described by $$P=(m1-m2)/(m1-m3) \quad (2)$$

or $$P=(m1-m2)/\rho At \quad (3)$$

wherein m1: total weight before anodization m2: total weight after anodization m3: total weight after removal of porous silicon $\rho$: density of monocrystalline silicon A: Area of porous region t: thickness of porous silicon However, the area of the porous region cannot be accurately calculated in many cases. In this case, although the equation (2) is effective, the porous silicon must be etched to accomplish the measurement of the value m3.

On the other hand, during epitaxial growth on the porous silicon, the porous silicon is capable of relieving distortion produced during heteroepitaxial growth and suppressing the generation of defects. Also in this case, it is clear that the porosity is a very important parameter, thus measurement of the porosity is necessary and indispensable.

There are known the following methods for etching the porous silicon:

(2-3-1) The method of etching porous silicon with an aqueous NaOH solution (G. Bonchil, R. Herino, K. Barla, and J. C. Pfister, J. Electrochem. Soc., Vol. 130, No. 7, 1611 (1983)).

(2-3-2) The method of etching porous silicon with an etching solution which is capable of etching monocrystalline silicon.

In the above method (2-3-2), a fluoronitric-acid-type etching solution is generally used, and etching of silicon proceeds as follows:

As shown by the above reaction formulas, Si is oxidized to $SiO_2$, and the resultant $SiO_2$ is etched with hydrofluoric acid, thus Si is etched.

In addition to the etchant for silicon crystal described above, other etchants are known such as ethylenediamine-type, KOH-type and hydrazine-type.

The etching solutions according to the above method (2-3-2) etch the crystalline silicon as well as porous silicon. Therefore, to accomplish the selective etching of the porous silicon, it is required to select etching solution capable of etching the porous silicon other than those for crystalline silicon described above. Thus, only aqueous NaOH solution has been used for selective etching of the porous silicon.

However, in the conventional method of selectively etching porous silicon with an aqueous NaOH solution, Na ions are inevitably adsorbed on the etched surface. The Na ions cause the primary impurity contamination which results in the interfacial states. Thus, Na ions must not be avoided to be introduced into the semiconductor process.

Moreover, as discussed above, the method (2-3) has significant problems that the size of n-type monocrystalline silicon is limited to 10×10 μm□ (G. Bomchil and A. Halimaoui, "Porous Silicon: The material and its application to SOI technologies", Microelectronic Engineering, 8(1988), pp.293–310)), and the substrate is warped. In the view of these problems, inventors have developed a method for forming a monocrystalline silicon layer on an insulating material, achieving the great improvement of the conventional technologies typically including the method (2-3).

FIGS. 1A to 1D are schematic sectional views showing the processes for forming a monocrystalline silicon layer on an insulating material. A 200 μm-thick p-type silicon substrate (not shown) is anodized with a current of current density of 100 mA/cm² in a 50% hydrofluoric acid solution for 24 minutes, then all the portion of the p-type silicon substrate becomes porous, thus the porous silicon substrate 1 is obtained as shown in FIG. 1A. Next, an epitaxial layer 2 is grown on the porous silicon substrate 1.

After that, a quartz substrate 3 is prepared and the epitaxial layer 2 on the porous silicon substrate is bonded to this quartz substrate 3 as shown in FIG. 1B. Then, the bonded porous silicon substrate is removed, while the monocrystalline epitaxial layer 2 remains on the quartz substrate 3 as shown in FIG. 1C. Further, as shown in FIG. 1D, the epitaxial layer 2 is partially etched to be divided into the isolated elements, that is, the epitaxial layer 2 is divided into the epitaxial layers 2a–2c.

Unfortunately, the method for forming a monocrystalline silicon layer on an insulating material described above has the problem that it takes long time to perform the process of forming the porous silicon substrate 1 because the whole p-type silicon substrate is required to be converted into the porous material. This is one of problems to be improved.

Another problem to be solved is its high cost due to the fact that a p-type silicon substrate can be used only once because the whole p-type silicon substrate must be etched away after being anodized into a porous material.

In the technology of "SOI with a bonded substrate", typically including the method (2-3), the process for thinning the silicon substrate is important. That is, it is required to thin a silicon substrate having large thickness such as a few hundred microns to a very small thickness of a few microns or less than one micron with a very good uniformity in the resultant thickness by means of polishing or etching. This has significant technical difficulty in controllability and uniformity of the resultant thickness. Although, among various SOI technologies, this method can give the highest quality of a thin monocrystalline layer, this technology has not been in use for production because of its difficulty in controlling the thickness.

When an insulating material other than silicon is used for a substrate to support silicon layer, there is another important problem in the SOI with a bonded substrate that stress results from the difference in thermal expansion coefficient between the silicon layer and the insulating substrate supporting the silicon layer. Such a stress almost never occurs when a silicon substrate is used as a supporting substrate (that is, silicon is bonded to a silicon substrate), but when an insulating substrate other than silicon, such as a glass, is used as a supporting substrate, there occur some problems during the heat treatment at about 1000° C. to increase the bonding strength after two substrates are bonded. For example, warpage or cracking might occur in the substrate with bonded two materials, or a substrate might come off the other substrate, due to the difference in thermal expansion coefficient between the two substrates. There are some examples attempting to synthesize a material having a thermal expansion coefficient near that of silicon for use as a supporting substrate, but, to our best knowledge, such materials do not have good heat-resistance and they can not endure high temperatures for the treatment to increase the bonding strength or for device fabrication processes. If the thickness of the silicon substrate is thinner, then there exist less possibility of warping or cracking in the substrate, or separation of the two substrates during heat treatment. However, even only 0.1 µm-thick monocrystalline silicon film leads to warpage which is large enough to give some errors in photomask alignment after the heat treatment in the conventional semiconductor fabrication processes.

SUMMARY OF THE INVENTION

It is an object of the present invention to provide a method for producing semiconductor articles which do not have such technical problems described above.

It is another object of the present invention to provide a method for producing semiconductor articles having a high quality semiconductor layer on an insulating layer, with a high production yield at a low cost without complicated fabrication processes.

It is another object of the present invention to provide a method for producing a semiconductor article wherein two large sized substrates can be easily bonded to each other with almost no voids or very few voids between the substrates.

It is another object of the present invention to provide a method for producing a semiconductor article wherein two substrates having different thermal expansion coefficients are easily bonded to each other.

It is another object of the present invention to provide a method for producing a semiconductor article wherein one of two substrates bonded to each other are easily removed from the other substrate with no occurrence of cracking, separation, or warpage in the semiconductor layer transferred to the substrate.

It is another object of the present invention to provide a method for producing a semiconductor article wherein dielectric isolation is easily provided between plural active regions keeping good flatness of semiconductor layers.

It is further object of the present invention to provide a method for producing a SOI semiconductor article with semiconductor layers having excellent crystallinity and almost no defects.

In order to achieve the above objects, the present invention provides the production method for producing a semiconductor article, comprising the steps of: preparing a first substrate having a non-porous semiconductor layer on a porous semiconductor region; bonding the first substrate to a second substrate so that the surface of the semiconductor layer side of the first substrate is in contact with the surface of the second substrate; removing the porous semiconductor region in the state that the semiconductor layer is bonded to the second substrate, thereby transferring the semiconductor layer onto the second substrate; and dividing the semiconductor layer into a plurality of island regions either before or after the step of bonding the first substrate to the second substrate.

In the present invention as described above, warpage and peeling of the semiconductor layer can be avoided because the semiconductor layer to be transferred is divided into plural semiconductor regions either before or after transferring the semiconductor layer.

DESCRIPTION OF THE PREFERRED EMBODIMENTS

In the following, there are described some preferred embodiments of the present invention, but this invention is not limited to those and it should be understood that there are other modifications to achieve the present invention.

An embodiment of the present invention includes a step for transferring a semiconductor layer formed on a porous semiconductor substrate onto another substrate. In this case, it is preferable to utilize a selective etching to remove only the porous semiconductor material. Therefore, selective etching technologies for the present invention will be described first.

Selective Etching

There are some etchants for selective etching, such as hydrofluoric nitric acetic acid, hydrofluoric acid (HF), and buffered hydrofluoric acid (BHF). These etchants may be used together with hydrogen peroxide ($H_2O_2$) or an alcohol as required.

In the case of hydrofluoric acid, HF concentration may be set preferably in the range from 1 to 95 %, more preferably in the range from 5 to 90%, and the most preferably in the range from 5 to 80%. When buffered hydrofluoric acid is used as a etchant, HF concentration may be set preferably in the range from 1 to 95%, more preferably in the range from 1 to 85%, and the most preferably in the range from 1 to 70%, and $NH_4F$ concentration may be set preferably in the range from 1 to 95%, more preferably in the range from 5 to 90%, and the most preferably in the range from 5 to 80%.

In the etchants, $H_2O_2$ concentration may be preferably in the range from 1 to 95%, more preferably in the range from 5 to 90%, and the most preferably in the range from 10 to 80%. The $H_2O_2$ concentration should be set to an effective value within the range described above. Furthermore, in the etchants, alcohol concentration may be preferably less than 80%, more preferably less than 60%, and the most preferably less than 40%. The alcohol concentration should be also set to an effective value within the range described above.

In the etching step, $H_2O_2$ acts as an oxidizing agent for a silicon semiconductor material, and it is possible to control the reaction rate by changing the $H_2O_2$ concentration. On the other hand, alcohol acts as a surface active agent and it removes instantly bubbles of gaseous products generated by etching reaction, thus leading to a good uniformity and high efficiency in the selective etching of a porous silicon material.

As an example of a method for selectively etching only porous silicon, the electroless wet chemical etching method will be described next.

Figure 1A:
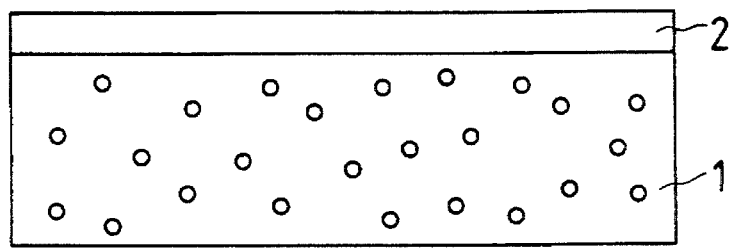
FIGS. 1A to 1D are schematic representation of the basic processes for producing a semiconductor article according to the present invention.
Figure 1B:
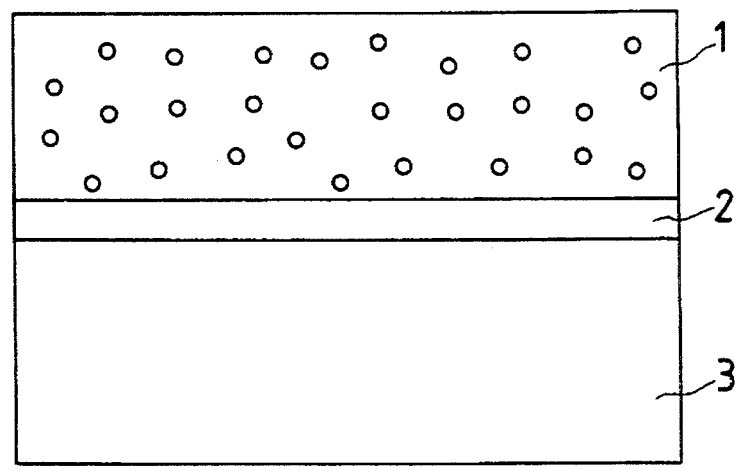
Figure 1C:
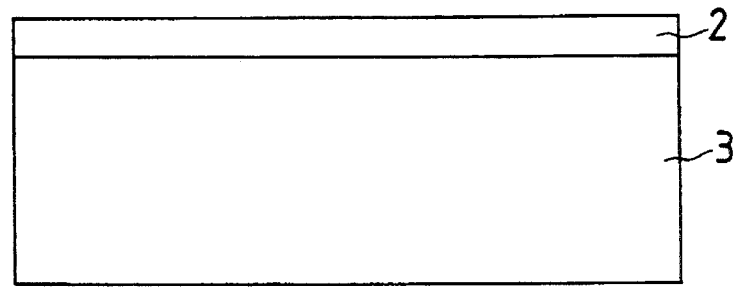
Figure 1D:
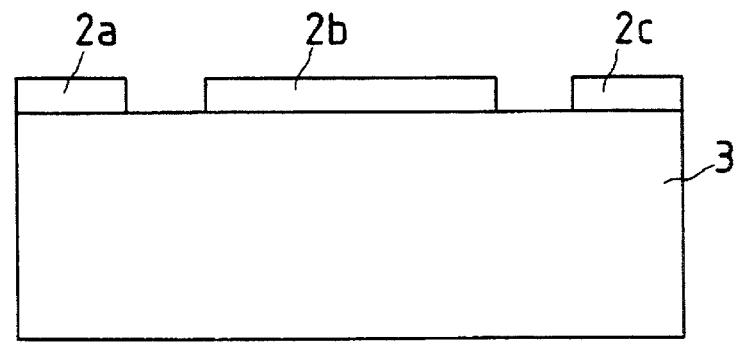
Figure 2:
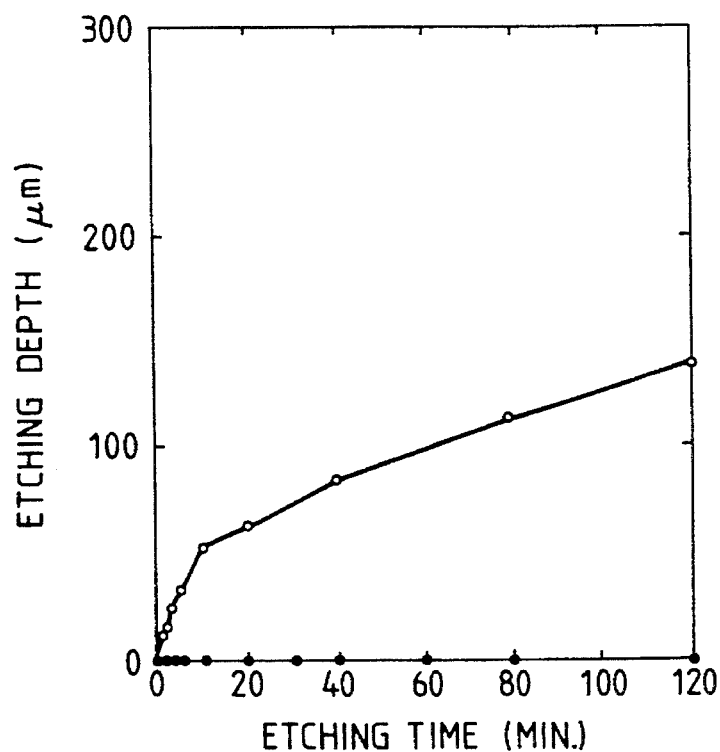
FIG. 2 is a graph showing the etching characteristics of the etchant with 49% HF:alcohol:30% $H_2O_2$ (10:6:50)

FIG. 2 is a plot of an etching depth of porous and monocrystalline silicon as a function of etching time, when both porous and monocrystalline silicon are dipped without stirring in the mixture solution of 49% HF, an alcohol and 30% $H_2O_2$. Here, the porous silicon used for this experiment was prepared by anodizing a monocrystalline silicon material in the condition shown below:

Applied Voltage: 2.6 V

Current Density: 30 $mA.cm^{-2}$

Anodizing Solution: $HF:H_2O:C_2H_5OH=1:1:1$

Time: 2.4 hours

Thickness of Porous Si: 300 μm

Porosity: 56%

The starting material for anodization to obtain porous silicon is not limited to monocrystalline silicon, but another type silicon crystal can be also used. The porous silicon produced in the above condition was dipped with no stirring in the mixture solution of 49% HF, an alcohol and 30% $H_2O_2$ (10:6:50) at room temperature, then the decrease in the thickness of the porous silicon was determined by a measurement. As shown in FIG. 2 (open circles), the porous silicon is etched very quickly, and, for example, it is etched by 80 μm after 40 minutes, 107 μm after 80 minutes respectively with excellent surface condition and good uniformity in thickness. The etching rate depends on the concentration of etchant and on its temperature.

In the etching, if hydrogen peroxide is added to the etchant, the oxidation of silicon will be accelerated and chemical reaction rate will be larger compared to the case of no addition of hydrogen peroxide. Furthermore, the reaction rate can be controlled by changing the amount of hydrogen peroxide.

On the other hand, 500 μm-thick non-porous silicon was also dipped with no stirring in the mixture solution of 49% HF, alcohol, and 30% $H_2O_2$ (10:6:50) at room temperature, then the decrease in the thickness of the non-porous silicon was determined by a measurement. The non-porous silicon showed very slight etching such as less than 50 Å even after 80 minutes (solid circles).

In the etching using an etchant including alcohol, gaseous bubbles of gas generated during the etching reaction can be removed instantly from etching surface with no necessity of stirring, thus uniform and high efficiency etching of porous silicon can be achieved.

After etching, the porous silicon and non-porous silicon were washed with water and the surface of these materials was analyzed by the secondary ion mass spectrometer. No impurity was detected in the analysis.

The concentration of the etchant and its temperature may be determined to obtain appropriate etching rate of porous silicon and selectivity in etching rate between porous silicon and non-porous silicon which are suitable for practical production processes.

Figure 3:
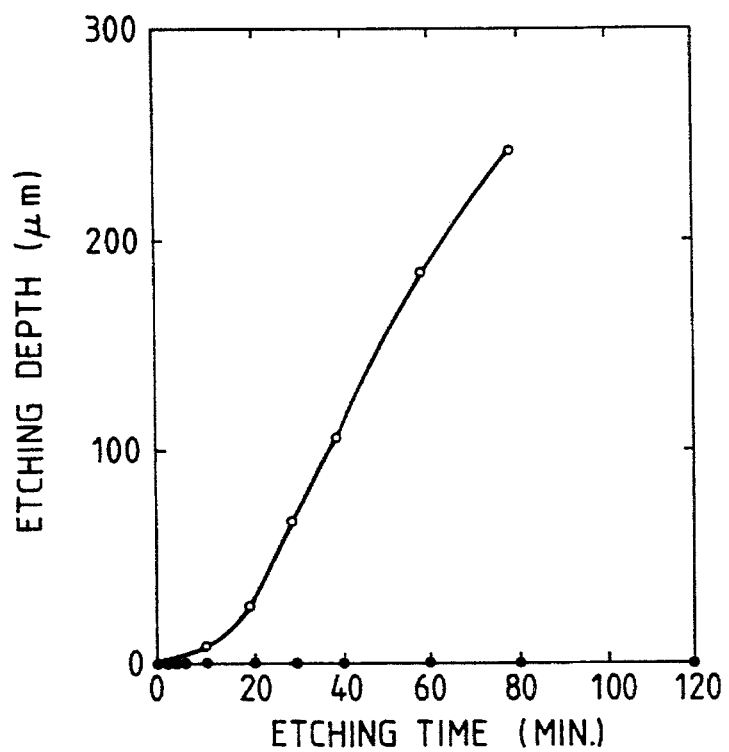
FIG. 3 is a graph showing the etching characteristics of the etchant with BHF:alcohol:30% $H_2O_2$ (10:6:50)
Figure 4:
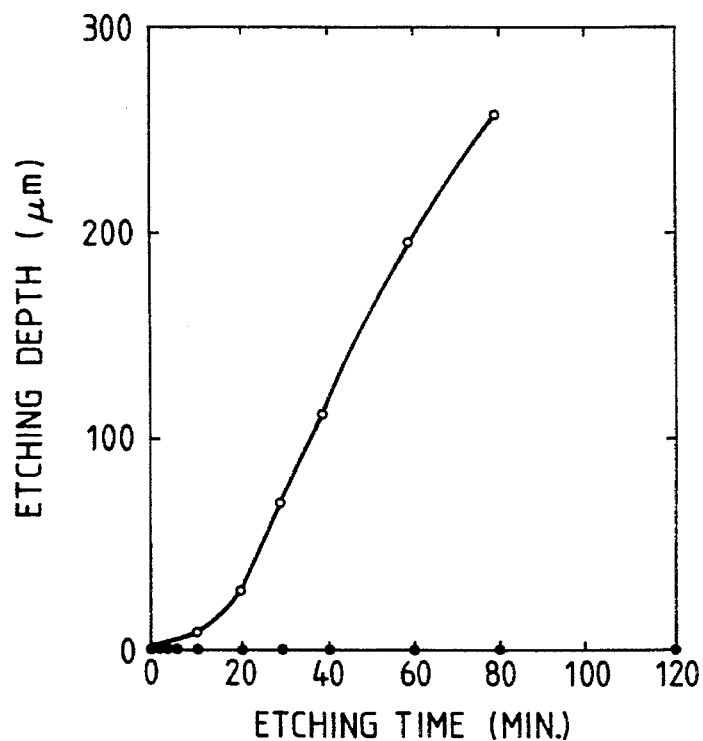
FIG. 4 is a graph showing the etching characteristics of the etchant with HF:$H_2O_2$ (1:5)
Figure 5:
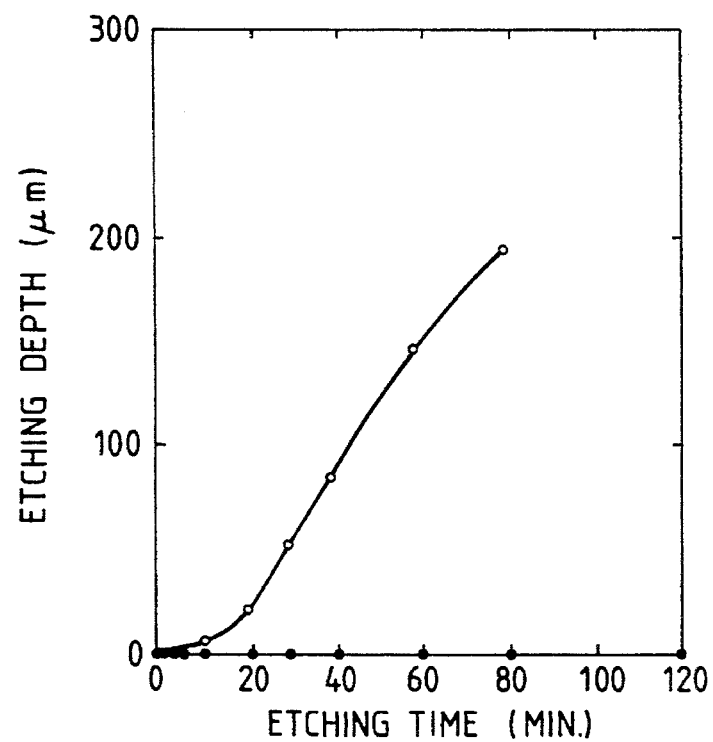
FIG. 5 is a graph showing the etching characteristics of the etchant with HF:alcohol (5:3)
Figure 6:
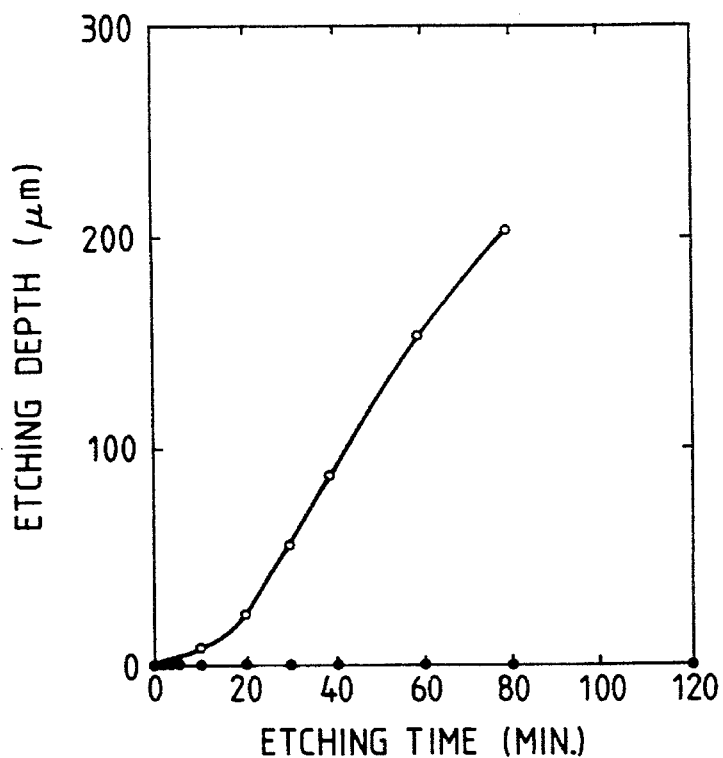
FIG. 6 is a graph showing the etching characteristics of the etchant with HF.
Figure 7:
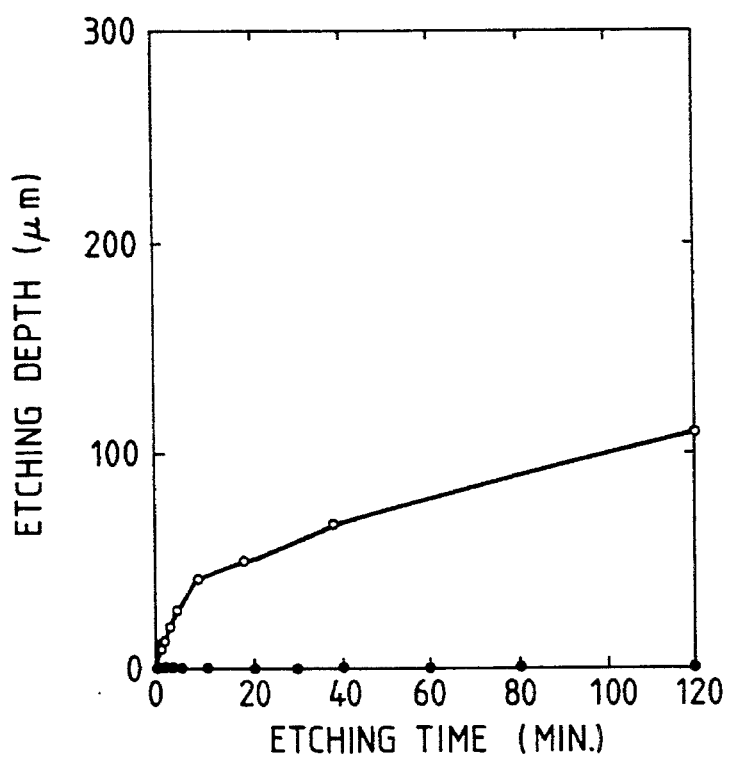
FIG. 7 is a graph showing the etching characteristics of the etchant with BHF: alcohol (5:3)
Figure 8:
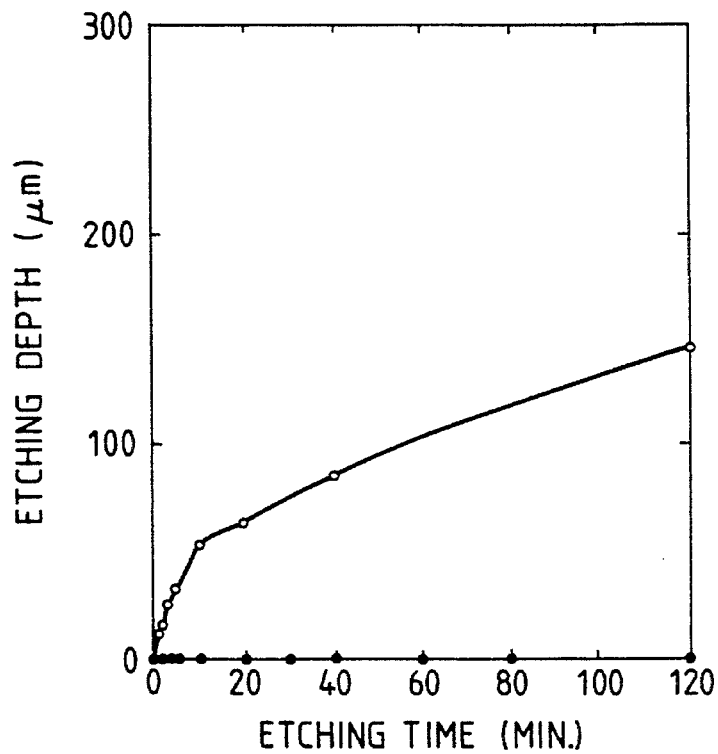
FIG. 8 is a graph showing the etching characteristics of the etchant with BHF: $H_2O_2$ (1:5)
Figure 9:
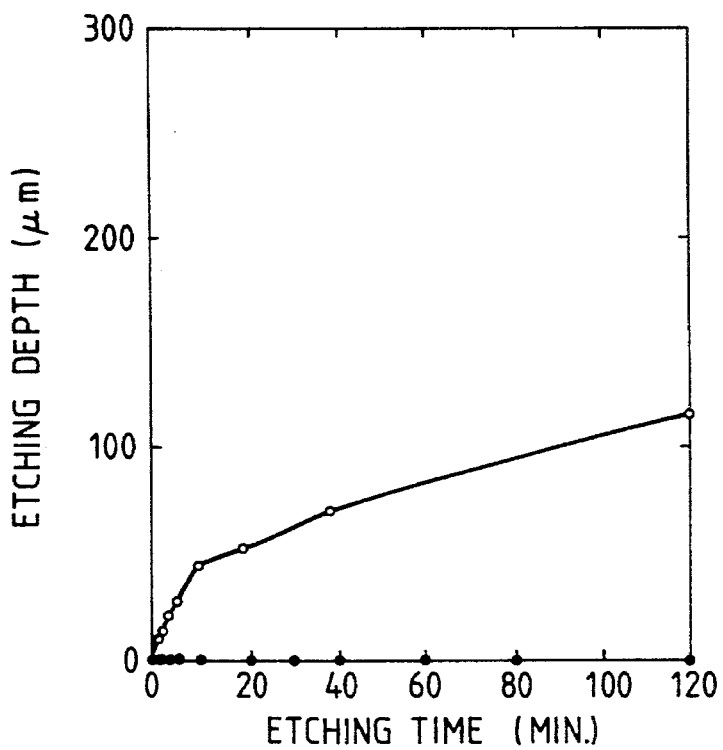
FIG. 9 is a graph showing the etching characteristics of the etchant with BHF.

Other following etching solutions can be also used for good selective etching, as shown in FIGS. 3–9. That is:

FIG. 3 shows the etching characteristics of the etchant with BHF:alcohol:30% $H_2O_2$ (10:6:50);

FIG. 4 shows the etching characteristics of the etchant with $HF:H_2O_2$ (1:5);

FIG. 5 shows the etching characteristics of the etchant with HF:alcohol (5:3);

FIG. 6 shows the etching characteristics of the etchant with HF;

FIG. 7 shows the etching characteristics of the etchant with BHF:alcohol (5:3);

FIG. 8 shows the etching characteristics of the etchant with BHF:H$_2$O$_2$ (1:5); and FIG. 9 shows the etching characteristics of the etchant with BHF.

The present invention is not limited to only substrates in the form of a plate, but it is also applicable to other substrates on which semiconductor devices can be placed, resulting in the similar effectiveness.

In the selective etching, etching temperature may be determined preferably in the range of 0° C. to 100° C., more preferably 5° C. to 80° C., and the most preferably 5° C. to 60° C.

Method for Forming Porous Semiconductor

Now, the method for forming a porous semiconductor for use in the present invention will be described next.

It is possible to make silicon substrates porous by anodizing them in HF solution. The density of the resultant porous silicon can be a certain value in the range from 0.6 to 1.1 g/cm$^3$ depending on the concentration of HF which may be in the range from 20 to 50%, while the density of monocrystalline silicon is 2.33 g/cm$^3$. Such a porous silicon material can be easily obtained when p-type silicon substrate was used as a starting material for the following reasons:

The porous silicon was discovered by Uhlir et al. in 1956 during the study on the electrolytic polishing of semiconductor materials (A. Uhlir, Bell Syst. Tech. J., Vol.35, p333 (1956)). Unagami et al. investigated dissolving reaction of Si during the anodic reaction of Si in a HF solution requires positive holes, and they concluded that the reaction occurs as follows (T. Unagami, J. Electrochem. Soc., Vol. 127, p. 476 (1980)):

$$Si+2HF+(2-n)e^+\rightarrow SiF_2+2H_2+ne^-$$

$$SiF_2+2HF\rightarrow SiF_4+H_2$$

$$SiF_4+2HF\rightarrow H_2SiF_6$$

or $$Si+4HF+(4-\lambda)e^+\rightarrow SiF_4+4H^++\lambda e^-$$

$$SiF_4+2HF\rightarrow H_2SiF_6$$

where e$^+$ and e$^-$ denote a hole and an electron respectively; n and $\lambda$ are the numbers of holes which are needed to dissolve one silicon atom and it is reported that the porous silicon can be formed when n>2 or $\lambda$>4.

Considering the fact described above, the p-type silicon can be easily made porous because the p-type Si has positive holes. Nagano and Imai verified empirically this selectivity in the conversion to porous materials (Nagano, Nakajima, Yasuno, Onaka, Kajiwara, Technical Report, Vol. 79 SSD79-9549 (1979), the Institute of Electronics, Information and Communication Engineers; K. Imai, Solid-State Electronics, Vol.24, 159 (1981)).

Because porous materials include a large number of voids, their density becomes less than a half of that of the original materials. As a result, the ratio of surface to volume increases extremely and the chemical etching rate also increases extremely compared with a general monocrystal silicon layer.

Figure 10A:
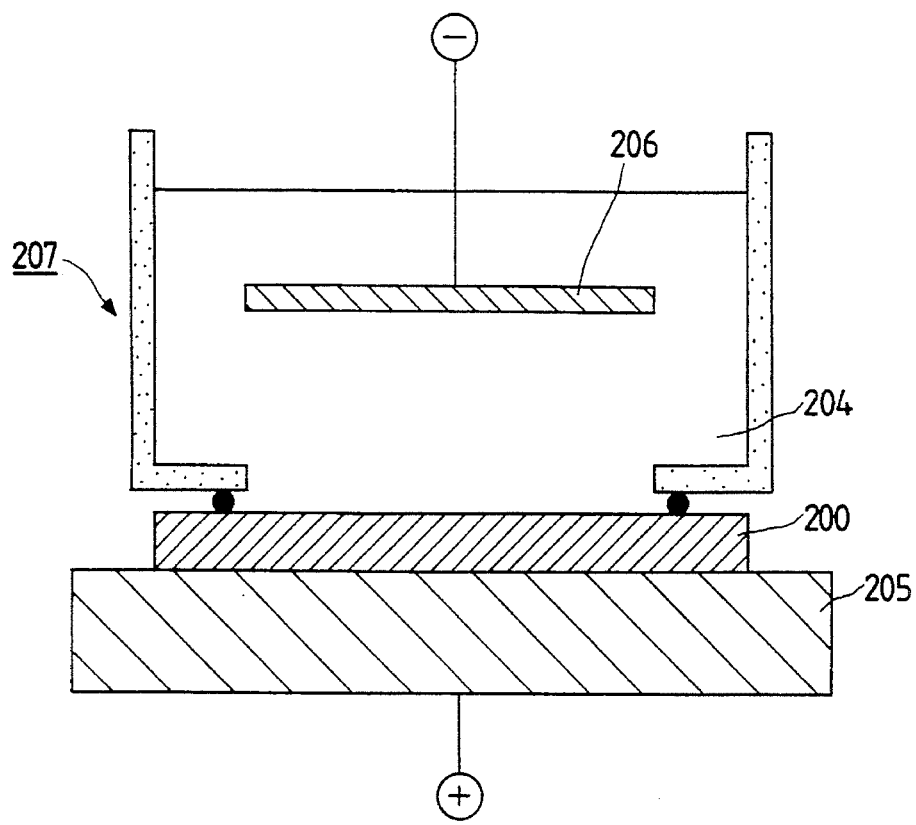
FIGS. 10A and 10B are schematic representations of two anodization apparatuses for use in the present invention.
Figure 10B:
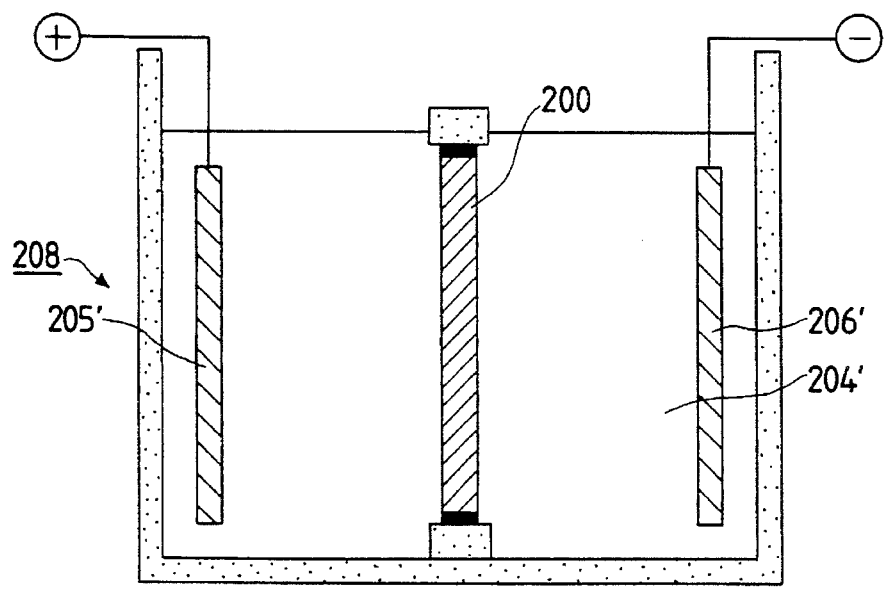

A more detailed method for producing the porous silicon will be described next, referring to FIG. 10A. First, a p-type monocrystalline silicon 200 is prepared as a substrate. N-type silicon may be also used, but its resistivity must be low enough. The substrate is set in the apparatus 207 so that one of surfaces of the substrate contacts with the HF-based solution 204. The other surface of the substrate contacts a positive metallic electrode 205. A negative electrode 206 exists in the solution to provide the electric connection to it. FIG. 10B shows an alternate apparatus 208 wherein a positive voltage is provided via the solution 204' having a positive electrode 205' in it. In any case, a porous structure occurs at the surface of the negative electrode side which contacts the solution. As for a HF-based solution 204, concentrated hydrofluoric acid (49%HF) is generally used. Addition of water to the solution is not desirable because the etching will occur when the solution is diluted further exceeding a certain degree, which depends on the magnitude of the current. During the anodization, gas bubbles are generated at the surface of the substrate 200. To remove these gas bubbles effectively, alcohol may be added as a surface active agent. As an alcohol for such a purpose, methanol, ethanol, propanol, iso-propanol and the like can be used. Alternatively, instead of the use of alcohol, a stirrer may be used to stir the solution during the anodization. As for the negative electrode 206, a material exhibiting corrosion resistance to hydrofluoric acid solution such as gold (Au) and platinum (Pt) is used. General metals can be used for a positive electrode 205, but it is desirable that the positive electrode is coated with a metallic film having corrosion resistance to hydrofluoric acid solution, because the hydrofluoric acid solution 204 will reach the positive electrode 205 when the whole substrate 200 is fully anodized. The maximum anodization current may be some hundreds mA/cm$^2$, while the minimum current is not zero. Preferable magnitude of the anodization current may be determined in the range which will allow the growth of high quality epitaxial layer on the anodized porous silicon. In general, when the anodization is carried out at high current density, a high anodization rate is obtained and the resultant porous silicon layer will exhibit a low density which means that the volume of voids will increase. This affects epitaxial growth conditions.

Method of Forming Semiconductor Layer on Porous Semiconductor

There are two typical methods for forming a semiconductor layer on a porous semiconductor substrate: a method wherein an epitaxial layer is grown on a porous semiconductor substrate; and a method wherein a monocrystalline semiconductor substrate is anodized to make it porous in a way described above except for the portion near the top surface.

The observation with a transmission electron microscope has revealed that a typical porous silicon contains voids of about 600 Å in average radius. As a result, the density of porous silicon is less than a half of that of monocrystalline silicon. In spite of this, porous silicon can retain sufficient crystallinity to grow an epitaxial layer of monocrystalline silicon on it.

However, high temperature treatment might change the characteristics of porous silicon. For example accelerated etching rate may change. Especially, at temperatures higher than 1000° C., the rearrangement of the internal voids occurs and the rapid etching rate will be reduced. Therefore, low temperature epitaxial growth technologies such as molecular beam epitaxial growth, plasma-assisted CVD, photo-assisted CVD, bias sputtering, and liquid phase epitaxial growth technologies are more desirable to grow a non-porous silicon epitaxial layer on a porous silicon layer.

Method for Forming Island Regions

The present invention includes a step wherein a semiconductor layer is divided into island regions either before or after the transferring of the semiconductor layer. Chemical etching or mechanical cutting may be used for such a separation process. However, more preferably, wet etching or dry etching such as reactive ion etching is used.

The semiconductor layer is etched to form grooves in it so that the semiconductor layer is separated into a plurality of island regions. These grooves will act as paths through which an etchant is introduced to etch the porous layer at the extremely increased etching rate during the later etching step. During etching step for forming grooves, it is more desirable to etch the porous layer as well as the semiconductor layer, because if the size of the grooves becomes larger then larger areas of the porous silicon are exposed, thus resulting in higher etching rate for the porous layer.

At least through the grooves which are produced as a result of etching of the semiconductor layer to form desired patterns, an etching solution is introduced. Therefore, in comparison with the case of having no groove, the etching rate is extremely accelerated by etching the porous layer at the grooves as well as at the side faces. In addition to forming grooves in the semiconductor layer, if grooves are formed in the porous layer by etching, then larger sizes of grooves are formed and larger areas of the porous layer are exposed thus resulting in higher etching rate.

It is desirable to fill those grooves, i.e. spaces between island regions formed in a way described above with an insulator to achieve dielectric isolation between devices. The step for forming such dielectric isolation may be performed before transferring the semiconductor layer, if the etching rate discussed above is not important.

First Substrate

As a first substrate comprising a porous semiconductor region and a semiconductor layer on it, the following substrates are used: a substrate comprising a semiconductor layer formed on a porous semiconductor substrate, a substrate comprising a part of non-porous semiconductor substrate made porous and the remaining part is used as a semiconductor layer, a substrate comprising a semiconductor layer formed on a substrate a part of which is made porous, etc. Before the bonding step, an insulating film such as oxide film or nitride film may be formed on the surface of the semiconductor layer.

Second Substrate

As for a second substrate onto which the semiconductor layer is transferred, the following materials may be used: a light-transmissive insulating substrate such as quartz or glass, and a semiconductor substrate with a oxide film or a nitride film thereon. In the latter case, the second substrate itself may have semiconductor devices such as a transistor.

In the island semiconductor regions formed by the step of bonding on the transferring step of removing the porous semiconductor as described above, MOS transistors and diodes are formed by known technologies such as a process disclosed in U.S. Pat. No. 5,040,041 to Yamada et al., entitled "Semiconductor Device and Signal Processing Device having said Device provided therein".

Thus obtained semiconductor articles having semiconductor devices can be high performance electron devices.

Embodiment 1

Figure 11A:
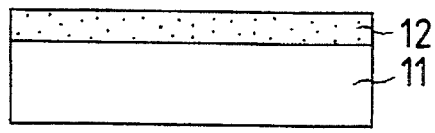
FIGS. 11A to 11G are schematic representations of processing steps for producing a semiconductor article according to the embodiment 1 of the present invention.

First, as shown in FIG. 11A, a monocrystalline silicon substrate 11 is prepared and a porous layer 12 is formed on it by making the surface of the substrate porous.

Figure 11B:
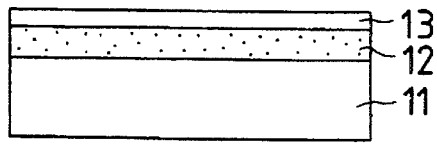

Then, as shown in FIG. 11B, epitaxial growth is carried out to form a non-porous monocrystalline silicon layer 13 on the surface of the porous substrate.

Figure 11C:
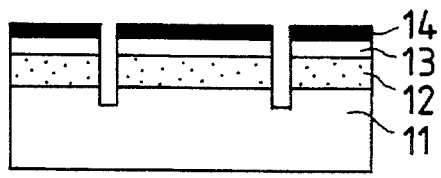

Further, a shown in FIG. 11C, using the conventional semiconductor process, a photoresist 14 is formed on the surface of non-porous silicon, then the non-porous silicon layer 13, the porous silicon layer 12 and the first silicon substrate 11 are etched to form grooves. This etching step can be carried out by a dry process such as RIE (reactive ion etching) which is used in the conventional semiconductor production process, or by a wet process using an aqueous solution of hydrofluoric acid and nitric acid.

Figure 11D:
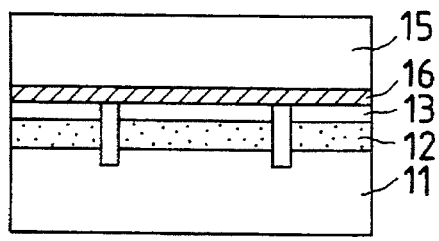

Now, as shown in FIG. 11D, another silicon substrate 15 (a second substrate) is prepared and an insulating layer 16 is formed on it. Then this silicon substrate 15 having the insulating layer 16 on it is bonded to the surface of the non-porous monocrystalline silicon layer 13 with grooves formed thereon by etching. Here, $SiO_2$ or SiN which is used in the conventional semiconductor process, may be used for an insulating layer 16, but the present invention is not limited to those.

Figure 11E:
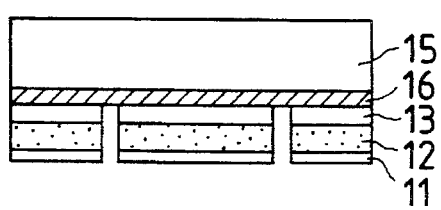

Then, as shown in FIG. 11E, the silicon substrate 11 is removed by polishing until the etching grooves described above are exposed.

Figure 11F:
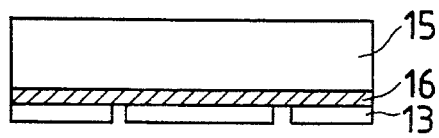

Furthermore, via the etching grooves, the whole porous silicon layer 12 is etched away by electroless chemical wet etching in a selective etchant such as hydrofluoric acid (or a buffered hydrofluoric acid, denoted as BHF hereafter), a mixture of hydrofluroic acid (or BHF) and an aqueous hydrogen peroxide, a mixture of hydrofluoric acid (or BHF) and an alcohol, or a mixture of hydrofluoric acid (or BHF), an aqueous hydrogen peroxide and an alcohol. Here, when a solution including an alcohol is used, no stirring is carried out during etching process, while the solution is stirred when a solution including no alcohol is used. Thus, the first silicon substrate 11 is removed by liftoff while the non-porous monocrystalline silicon layer 13 remains on the insulating layer 16. (FIG. 11F)

Figure 11G:
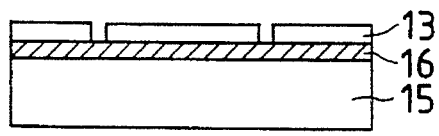

FIG. 11G shows the semiconductor substrate obtained according to the present invention. On insulating substrates 15 and 16, a monocrystalline silicon layer 13 having the same crystallinity as that of a silicon wafer is formed with good flatness and good uniformity in thickness. This semiconductor substrate is advantageously used for the fabrication of electronic devices at least based on the fact that devices are dielectrically isolated from each other.

Figure 12:
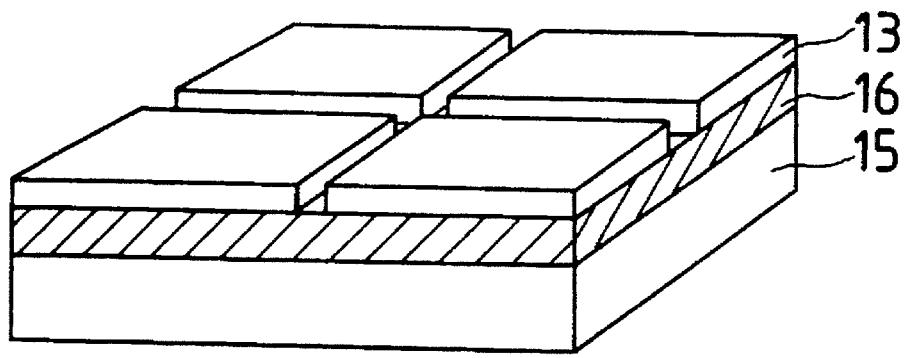
FIG. 12 is a schematic perspective view of an example of a semiconductor article according to the present invention.
Figure 13:
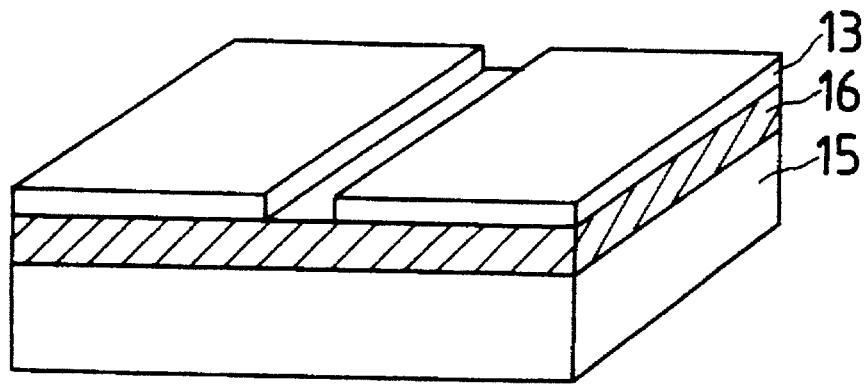
FIG. 13 is a schematic perspective view of an example of a semiconductor article according to the present invention.

FIGS. 12 and 13 are perspective views of a semiconductor substrate fabricated according to the present invention, and each Figure shows a substrate having a plurality of crystal islands isolated from each other by grooves which are different in a shape between each other.

The groove of the present invention is not limited to those grooves as shown in FIGS. 12 and 13, but any shape which divides the semiconductor layer into a plurality of islands can be used. More specifically, any grooves can be used which lead to islands in a form of circle, ellipse, or polygon such as triangle and pentagon.

Embodiment 2

Figure 14A:
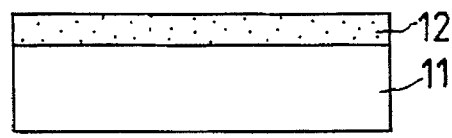
FIGS. 14A to 14G are schematic representations of processing steps for producing a semiconductor article according to the embodiment 2 of the present invention.

Embodiment 2 of the present invention will be described, referring to the drawings. In this embodiment 2, a monocrystalline silicon substrate 11 is prepared first as shown in FIG. 14A, and a porous silicon layer 12 is formed on it by making the surface of the substrate 11 porous. Here, the substrate is made porous by anodization using hydrofluoric acid solution.

Figure 14B:
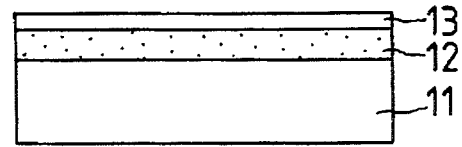

Then, as shown in FIG. 14B, a non-porous monocrystalline silicon layer 13 is formed on the surface of the porous substrate using any one of various growth methods.

Figure 14C:
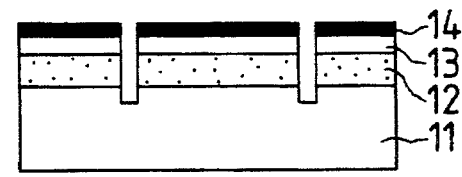

Further, as shown in FIG. 14C, using the conventional semiconductor process, a pattern of resist 14 is formed on the surface of non-porous silicon, then the non-porous silicon layer, the porous silicon layer and the silicon substrate are etched to form grooves. This etching step can be carried out by a dry process such as RIE (reactive ion etching) which is used in the conventional semiconductor production process, or by a wet process using an aqueous solution of hydrofluoric acid and nitric acid, and there is no restriction with respect to the etching method.

Figure 14D:
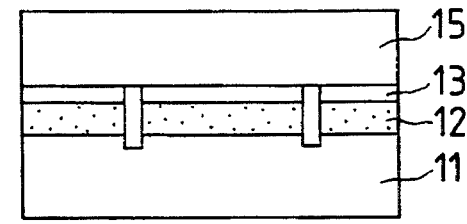

Now, as shown in FIG. 14D, a light-transmissive substrate 15, typically such as glass, is prepared. Then this light-transmissive substrate 15 is bonded to the surface of the non-porous monocrystalline silicon layer formed on the porous silicon substrate.

Figure 14E:
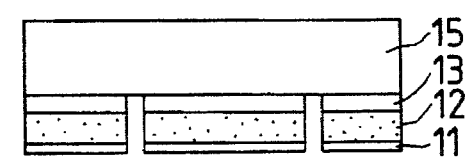

Then, as shown in FIG. 14E, the silicon substrate is removed by polishing until the etching grooves described above are exposed.

Figure 14F:
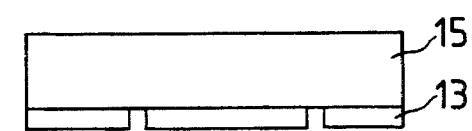

Furthermore, via the etching grooves, the whole porous silicon layer 12 is selectively etched away by electroless chemical wet etching in a selective etchant such as hydrofluoric acid (or BHF), or a mixture of hydrofluoric acid (or BHF) and an aqueous hydrogen peroxide or an alcohol. Here, when a solution including an alcohol is used, no stirring is carried out during etching process, while the solution is stirred when a solution including no alcohol is used. Thus, the silicon substrate 11 is removed by liftoff while the monocrystalline silicon layer 13 remains on the light-transmissive layer 15 (FIG. 14F).

Figure 14G:
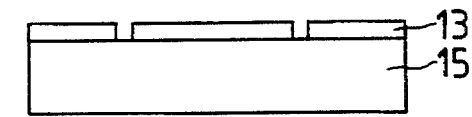
Figure 15:
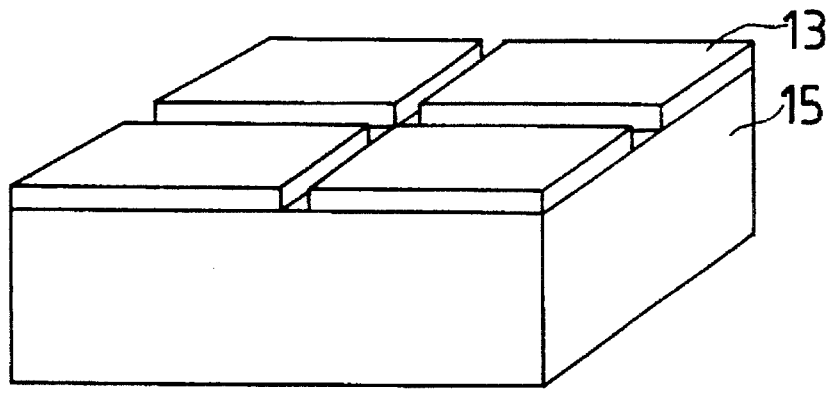
FIG. 15 is a schematic perspective view of another example of a semiconductor article according to the present invention.
Figure 16:
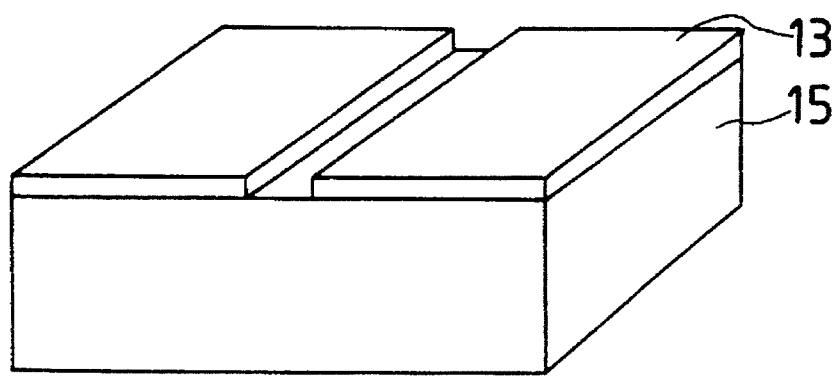
FIG. 16 is a schematic perspective view of another example of a semiconductor article according to the present invention.

FIG. 14G shows the semiconductor substrate obtained according to the present invention. On an light-transmissive substrate 15, the monocrystalline silicon layer 13 having the same crystallinity as that of a silicon wafer is formed with good flatness and good uniformity in thickness. This semiconductor substrate is advantageously used for the fabrication of electronic devices based on the fact that devices are dielectrically isolated from each other. FIGS. 15 and 16 are perspective views of a semiconductor substrate fabricated according to the present invention.

Embodiment 3

FIGS. 17A to 17D are schematic views for explaining the steps of embodiment 3 of a method for producing a semiconductor article according to the present invention.

Figure 17A:
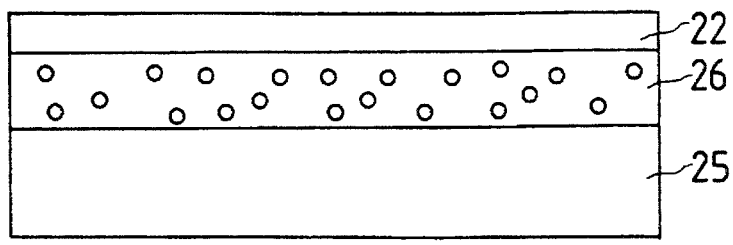
FIGS. 17A to 17D are schematic representations of processing steps for producing a semiconductor article according to the embodiment 3 of the present invention.

First, as shown in FIG. 17A, a 500 μm-thick p-type silicon substrate 25 is anodized in a solution, for example $HF:H_2O:C_2H_5OH=1:1:1$, at a current density of 30 mA/cm$^2$ for 10 minutes to form a 20 μm-thick porous silicon layer 26. Then an epitaxial layer 22 is grown using SiH$_4$ as a source gas in H$_2$ atmosphere at a pressure of $1\times10^{-2}$ at 850° C. for 30 minutes.

Figure 17B:
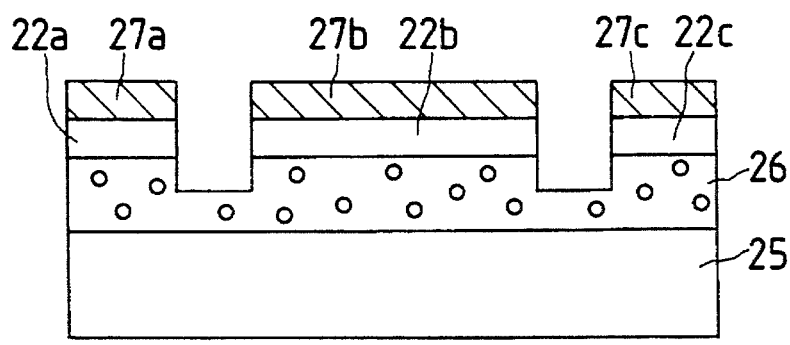

Furthermore, as shown in FIG. 17B, desired portions of the epitaxial layer 22 and the porous silicon layer 26 are removed by RIE using resists 27a–27c remaining on the regions for forming devices as a mask, thereby dividing the epitaxial layer 22 into epitaxial layers 22a–22c.

Figure 17C:
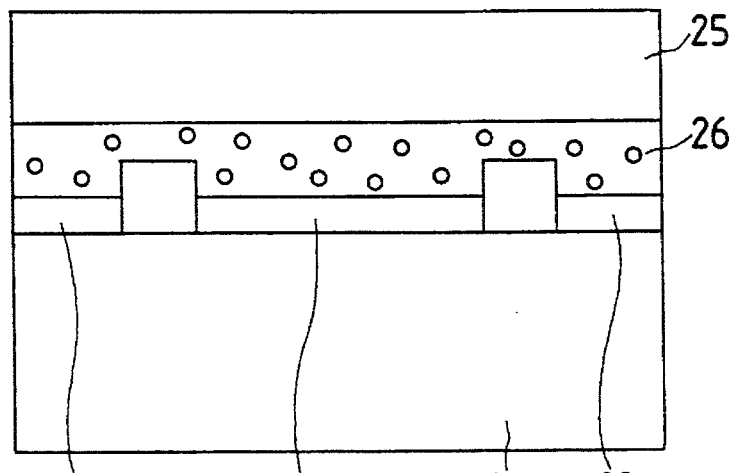

Then, as shown in FIG. 17C, after resists 27a–27c are removed, the epitaxial layers 22a–22c are placed on a quartz substrate 23 so that the surfaces of epitaxial layers 22a–22c get in contact with the surface of quartz substrate 23, and these substrates are heated in the atmosphere of nitrogen at 600° C. for 1 hour to bond the epitaxial layers 22a–22c to the quartz substrate 23.

Figure 17D:
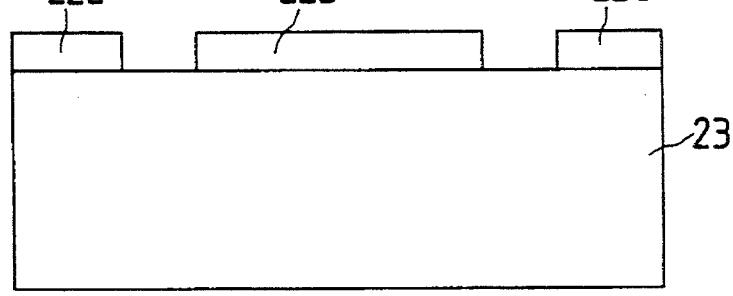

Next, as shown in FIG. 17D, the porous silicon layer 26 on the bonded p-type silicon substrate 25 is removed by selectively etching only the porous silicon layer 26 with a mixed solution of a buffered HF, an alcohol and an aqueous hydrogen peroxide (10:6:50). Thus, after the p-type silicon substrate 25 is separated, the epitaxial layers 22a–22c are formed on the quartz substrate 23.

Embodiment 4

FIGS. 18A to 18D are schematic views for explaining the steps of embodiment 4 of a method for producing a semiconductor article according to the present invention. In these Figures, the same members as those in FIGS. 17A to 17D are denoted by the same signs.

Figure 18A:
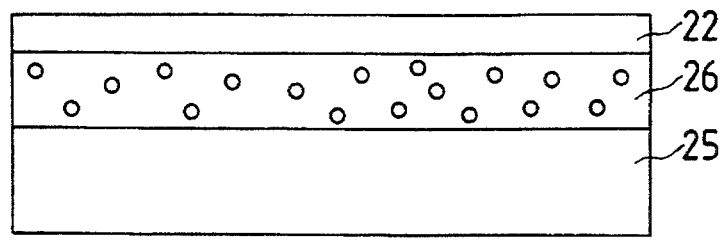
FIGS. 18A to 18D are schematic representations of processing steps for producing a semiconductor article according to the embodiment 4 of the present invention.

First, as shown in FIG. 18A, a porous silicon layer 26 and an epitaxial layer 22 are formed on a p-type silicon substrate 25.

Figure 18B:
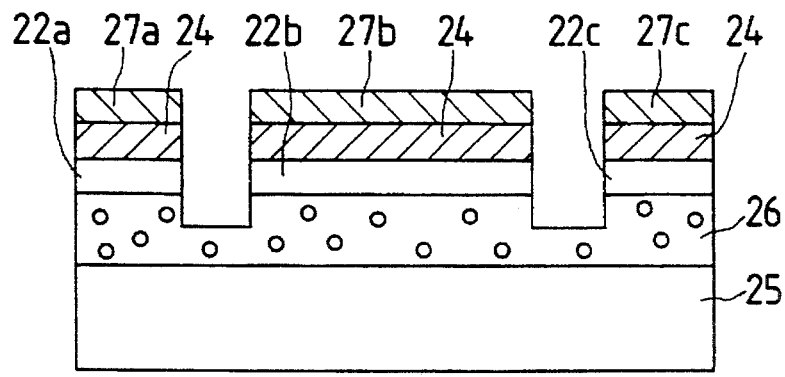

Then, as shown in FIG. 18B, a 5000 μm-thick silicon oxidized film 24 is formed on the epitaxial layer 22. Further, the desired portions of the silicon oxidized film 24, the epitaxial layer 22 and the porous silicon layer 26 are removed by RIE using resists 27a–27c remaining on regions for forming devices as a mask, thereby dividing the epitaxial layer 22 into epitaxial layers 22a–22c.

Figure 18C:
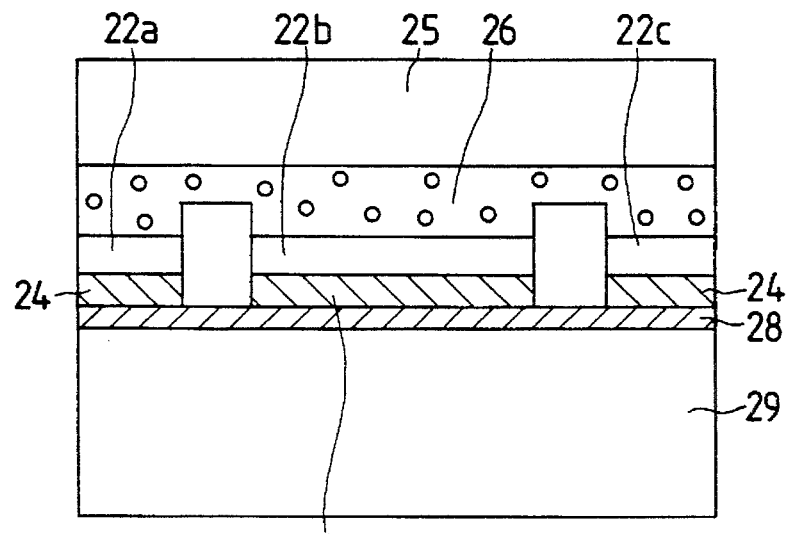

Next, as shown in FIG. 18C, after resists 27a–27c are removed, the silicon oxidized film 24 is placed on another silicon substrate 29 having a 3000 μm-thick silicon oxidized film 28 on its surface so that the surface of silicon dioxide layer 24 gets in contact with the silicon oxidized film 28 on the silicon substrate 29, and these substrates are heated in the atmosphere of nitrogen at 800° C. for 1 hour to bond the silicon oxidized film 28 of the silicon substrate 29 to the silicon oxidized film 24 of the p-type silicon substrate 25.

Figure 18D:
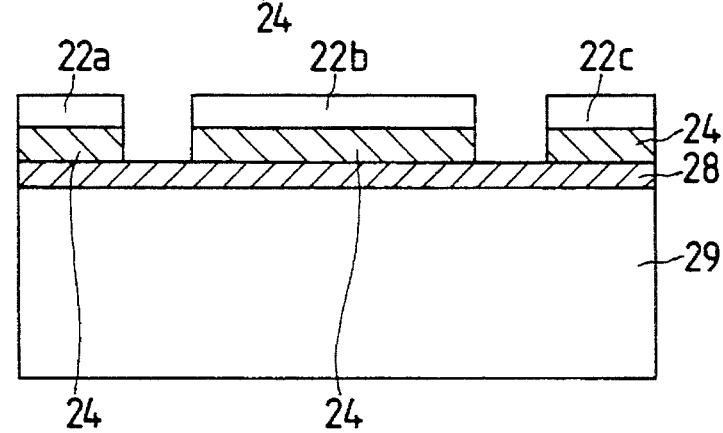

Then, as shown in FIG. 18D, the p-type silicon substrate 25 is separated by selectively etching only the porous silicon layer 26, thus the epitaxial layers 22a–22c are formed on the silicon oxidized films 28 and 24 on the silicon substrate 29.

As described above, in the embodiments 3 and 4 of the methods for producing semiconductor articles according to the present invention, only the surface of a semiconductor substrate is made porous. Therefore, it is possible to reduce the time required for forming the porous region. The non-porous portion of the semiconductor substrate is almost not etched during the step of etching the porous layer due to its small enough etching rate compared with that of the porous layer. As a result, the non-porous semiconductor substrate can be used again for another semiconductor article production. Thus it is possible to extremely reduce the process time for forming the porous region, and it is also possible to reduce the material cost because of the capability of reuse of the semiconductor substrate.

In the above method for producing semiconductor articles, through the grooves which are formed as a result of etching of the epitaxial layer to form desired patterns, an etching solution is introduced, thus introduced etching solution extremely accelerates the etching rate by etching the porous layer at the grooves as well as at the side faces of the porous layer. Thus etching rate of the porous layer is extremely increased compared with the case of no grooves.

Embodiment 5

In the following, silicon will be taken as an example of semiconductor material for explanation of this embodiment 5 of the present invention. The semiconductor material of the present invention is not limited to silicon.

FIGS. 19A to 19G are schematic views for explanation of the steps of the embodiment 5 of a method for producing a semiconductor article according to the present invention.

Figure 19A:
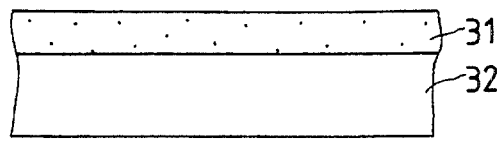
FIGS. 19A to 19G are schematic representations of processing steps for producing a semiconductor article according to the embodiment 5 of the present invention.

First, a p-type monocrystalline silicon layer 31 is formed by implanting boron ions or the like into the surface of the n-type silicon substrate 32. The p-type monocrystalline silicon layer 31 is converted to the porous silicon layer 31 by anodization using hydrofluoric acid solution. While the density of monocrystalline silicon is 2.33 g/cm$^3$, the density of the porous silicon layer 31 can be varied in the range from 0.6 to 1.1 g/cm$^3$ depending on the HF concentration which may be in the range from 20 to 50% (FIG. 19A).

Figure 19B:
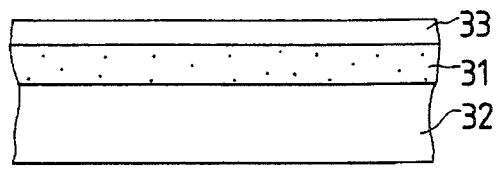

Then, as shown in FIG. 19B, an excellent crystallinity non-porous monocrystalline semiconductor layer 33 is grown on the porous silicon layer 31.

Figure 19C:
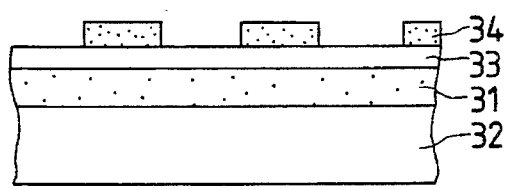

Furthermore, an insulating layer 34 such as a silicon oxidized film is formed and patterned into a desired pattern resulting in unevenness on its surface (FIG. 19C).

Figure 19D:
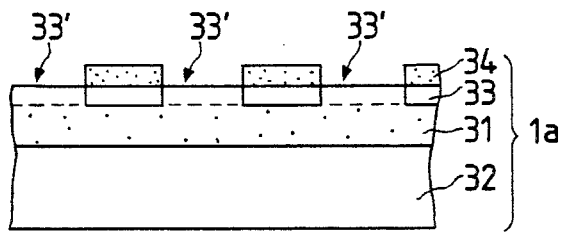

Next, as shown in FIG. 19D, using the insulating layer 34 as a mask material, anodization is carried out again to convert the exposed portions of the non-porous monocrystalline semiconductor layer 33 to the porous layer 33'.

Figure 19E:
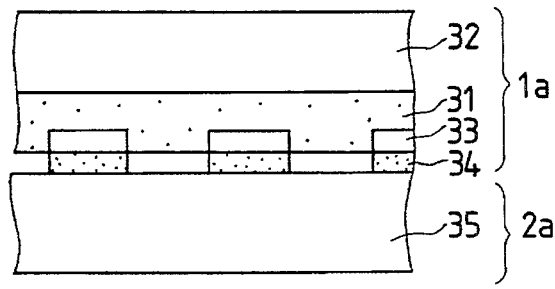

Then, as shown in FIG. 19E, another silicon substrate 35 is prepared as a second substrate, and the second substrate is bonded to the surface of the insulating layer 34 on the first substrate. In this embodiment, as shown in FIG. 19E, because the first substrate and the second substrate are bonded to each other at the surface with unevenness, the resultant contact area is small and better adhesion can be obtained compared with the case of the whole area contact of the flat surfaces. In addition, it is possible to reduce the generation of the void at the contact interface. Then the bonding strength is made larger by appropriate heat treatment.

Figure 19F:
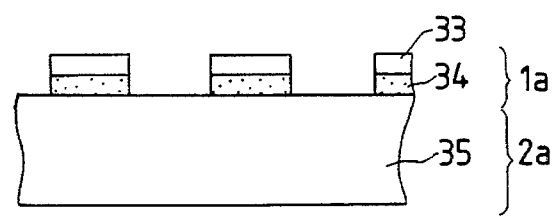

After that, as shown in FIG. 19F, the whole porous silicon layer 31 is removed by etching to form a thin monocrystalline silicon layer 33 on the insulating layer 34.

Thus the monocrystalline silicon layer 33 having the same crystallinity as that of a silicon wafer is formed on the substrate 35 via the insulating layer 34, wherein the monocrystalline silicon layer 33 is selectively formed only at desired areas on the wafer and it has good flatness and thin thickness of good uniformity.

The obtained semiconductor substrate can be preferably used for the fabrication of electronic devices based on the fact that devices are dielectrically isolated from each other.

Embodiment 6

Referring to FIG. 20, another embodiment 6 of the present invention will be described below.

A monocrystalline silicon substrate 100 is anodized to form a porous silicon layer 101 on it. Here, only one side of a surface layer of the substrate may be anodized, or otherwise the whole of the substrate may be anodized. In the case of the one side of the surface layer anodization, the thickness of anodized region may be in the range from 10 to 100 μm (Step A). The numeral 101' illustrates a substrate which is anodized at its one side of surface layer, and the numeral 101" illustrates that whole of the substrate is anodized.

A non-porous monocrystalline silicon layer 102 is epitaxially grown on the porous substrate or the porous layer 101 which is prepared in a way described above (Step A). The epitaxial growth may be carried out by usual thermal CVD, low-pressure CVD, plasma CVD, molecular beam epitaxy, sputtering or the like. The thickness of film to be grown may be determined so that it will meet the SOI design requirement. However, a thickness less than 2 μm might be preferable, because when a monocrystalline silicon film thicker than 2 μm is adhered to a transparent insulating substrate containing $SiO_2$ as a main component, large stress is caused at the bonded interface during heat treatment due to the difference in thermal expansion coefficient between these two materials, which might lead to cracking in the silicon film, warping of the substrate, or separation of the two materials at the interface. When the thickness is less than 2 μm, the stress will be small enough to avoid cracking in the film, warping of the substrate, and separation.

A supporting substrate of the transparent insulating substrate 110 containing $SiO_2$ as a main component is bonded to the surface of the epitaxial surface grown, then first heat treatment is carried out to ensure the interface bonding strength strong enough to endure the following processes such as polishing and etching. Here, a material such as fused silica glass, synthesized quartz, high-melting point (crystallized) glass can be used for the transparent insulating substrate 110. While the appropriate temperature of the heat treatment depends on the thickness of the silicon substrate and the insulating substrate, a temperature of less than 600° C. is preferable. For example, when 500–600 μm-thick silica glass is used as an insulating substrate and a silicon substrate of the same thickness is bonded to the insulating substrate, about 200°–250° C. heat treatment will lead to the separation of the two substrates from each other. If the thickness of silicon substrate is reduced to 300 μm, keeping the same thickness for the insulating substrate, then the substrates will endure up to about 400°–450° C. heat treatment. It might be possible to raise the critical temperature by reducing the thickness of silicon substrate, but this will not have practical importance because about 400°–500° C. is high enough to give the strong bonding strength which will endure the following polishing and etching. Thus, higher temperature is not necessary for heat treatment from practical point of view. The primary purpose of the first heat treatment is to obtain the bonding strength which is strong enough to endure the shearing stress during the polishing process. Therefore, if the following process to form the remaining silicon film is carried out only by etching without polishing, the first heat treatment is not necessarily required. That is, the intermolecular bonding which is induced at the interface when the two substrates are contacted at room temperature is strong enough for the etching process.

In the next step D, the porous portion 101 of the substrate is selectively removed, while the epitaxial grown layer 102 remains. When the whole portion to be removed is fully porous, the whole bonded substrates may be dipped in hydrofluoric acid-based (HF-based) solution to selectively remove the porous portion 101. On the other hand, when the portion to be removed includes monocrystalline silicon 100, it is preferable to remove only the silicon substrate 100 by polishing. The polishing is ended when the porous portion 101 is exposed, and then the porous portion 101 can be selectively removed by etching with a hydrofluoric acid-based solution.

In any case, the non-porous monocrystalline epitaxial grown portion 102 hardly reacts with hydrofluoric acid and it remains as a thin film. Because the supporting substrate 110 comprises mainly $SiO_2$, it easily reacts with HF-based solution. Therefore, it is preferable to deposit a silicon nitride film or a material which does not react with hydrofluoric acid, on the back surface opposite to the bonded surface, Otherwise, if the porous portion 101 is thinned to a certain degree before dipping the substrate in the etchant, then it will take just short time to selectively etch the porous portion, and it will be possible to protect the supporting substrate from reaction with hydrofluoric acid. As a HF-based solution, a mixture of hydrofluoric acid, aqueous hydrogen peroxide ($H_2O_2$), and alcohol is used. A mixture of hydrofluoric acid and nitric acid, or a mixture further including acetic acid can be also used to selectively etch the porous silicon. However, in this case, precise time control is required because a monocrystalline silicon thin layer, which should remain, is also somewhat etched.

In the final step E, the monocrystalline silicon thin film 102 on the transparent insulating substrate 110 is separated into islands by the usual photolithography and etching process. The size of islands to be separated, which also depend on a process temperature for fabricating devices, may be about 600×600 $\mu m^2$ in the maximum case. Larger size than that might result in separation of thin film from the substrate during processing due to the stress. Smaller area of the island will lead to less influence by the stress. However, in the practical production, the definition of the island should be made to meet the requirement of designed element size or shape of the device.

After the monocrystalline silicon film 102 is separated into islands, a second heat treatment is carried out at higher than 800° C. to increase the bonding strength at the interface between the thin film 102 and the substrate 110. A certain high temperature process such as oxidation during element fabrication can take place of the second heat treatment. A temperature below 800° C. can not give the bonding strength strong enough, and the thin film might separate from the substrate. More preferably, the second heat treatment may be done at a temperature in the range from 1000° to 1100° C.

Embodiment 7

In this embodiment 7, the whole of 200 μm-thick monocrystalline p-type (100) Si substrate is changed into a porous material by anodizing it in 50% HF solution at current density of 100 mA/cm². In this case, the anodization rate is 8.4 μm/min, therefore the whole substrate is anodized for 24 minutes.

Figure 21:
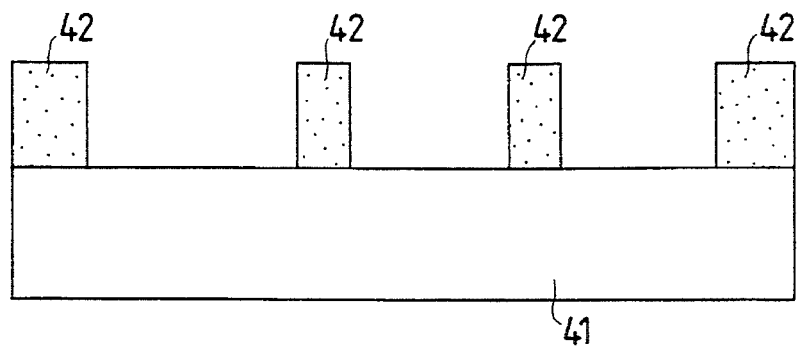
FIGS. 21 to 26 are schematic representations of processing steps for producing a semiconductor article according to the embodiment 7 of the present invention.

Then, 1 μm-thick SiN film for element isolation is formed on the porous Si substrate by plasma CVD method. The insulating film other than the area corresponding to the dielectric isolation region is removed. (That is, the insulating film which is the region corresponding to the region to be formed a semiconductor device is removed.) Thus, as shown in FIG. 21, the structure is obtained wherein an insulating film 42 is formed by patterning only in the region for dielectric isolation on the porous Si substrate 41.

Figure 22:
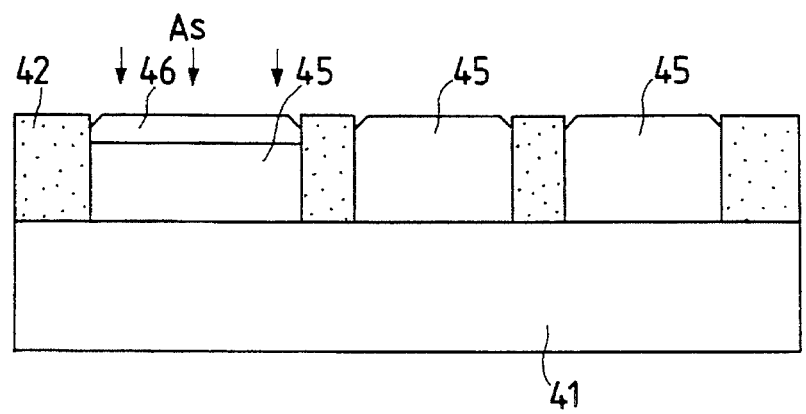

Furthermore, as shown in FIG. 22, a monocrystalline silicon layer 45 is formed on the porous Si substrate 41 only in the region where there is no insulating layer 42 by selective epitaxial growth so that the thickness of the monocrystalline silicon layer 45 is almost the same as that of the insulating layer 42. The epitaxial growth can be performed by low-pressure CVD method in the following conditions:

| Gas: | SiH₂Cl₂ | 1000 SCCM |
|---|---|---|
| | HCl | 150 SCCM |
| | H₂ | 230 SLM |
| Temperature: | 1000° C. | |
| Pressure: | 80 Torr | |
| Time: | 2.5 minutes | |

Then, as shown in FIG. 22, As of an n-type impurity is introduced into the upper part of the region of the monocrystalline Si layer where NPN transistors are to be formed (the region on the left side of FIG. 22), thus n-type region 46 is formed.

Figure 23:
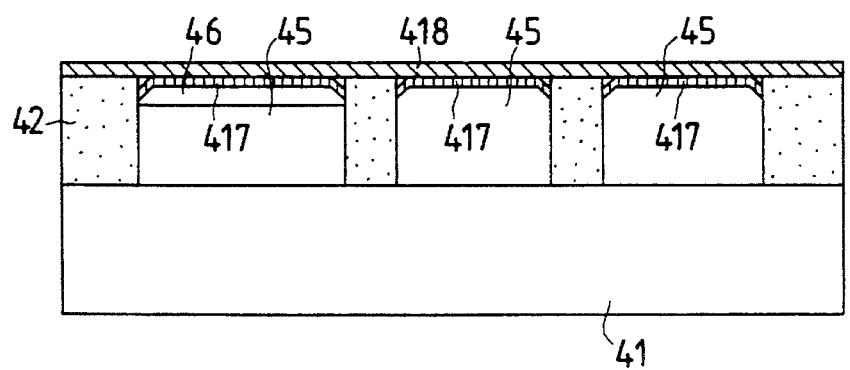

Furthermore, the surface of the monocrystalline Si layer 45 (including n-type region 46) is oxidized to form a 500 Å-thick oxidized Si layer 417. Then 2000 Å-thick BPSG film 418 is deposited by CVD method, and is heated at 900° C. for reflowing. Thus, the fine structure due to the facets generated during the epitaxial growth is covered and the well-flattened upper surface can be obtained as shown in FIG. 23.

Figure 24:
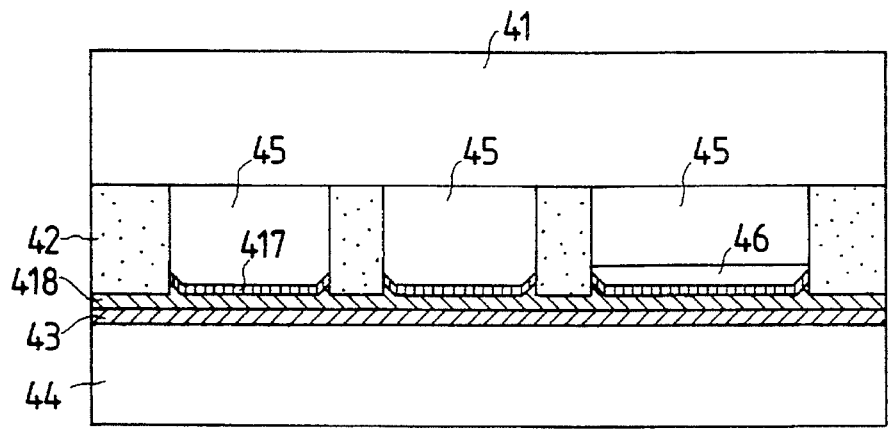

Now, as shown in FIG. 24, a 5000 Å-thick oxidized Si layer 43 formed on the surface of the Si substrate 44 is bonded to the BPSG film 418. This bonding can be achieved, for example, as follows: the surfaces to be bonded are cleaned, each surface to be bonded is contacted with each other, and heat treatment is carried out. The heat treatment is performed in an atmosphere such as oxygen, nitrogen, hydrogen, or inert gas at a temperature of higher than 600° C. In general, higher temperature results in stronger bonding at the interface. The preferable heat treatment condition in this embodiment is temperature of 1000° C. for 30 minutes in oxygen atmosphere. This leads to strong bonding.

Then, the porous Si substrate 41 is removed by etching with etchant having high selective ratio in etching for the porous Si to the non-porous Si. A mixture of hydrofluoric acid, nitric acid, and acetic acid can be preferably used as an etchant for this purpose. For example, while an etching rate for the non-porous Si to the mixture solution of hydrofluoric acid, nitric acid, and acetic acid (1:3:8) is about 1 μm/min, an etching rate for the porous monocrystalline Si is 100 times as fast as non-porous Si. Therefore, this etchant can etch the 200 μm-thick porous Si substrate 41 for 2 minutes. Thus, as shown in FIG. 25, the semiconductor substrate is obtained wherein 1 μm-thick flat-surface (upper surface) monocrystalline Si layer 45 is formed on the Si substrate 44 via the insulating layer comprising the oxidized Si layer 43, the BPSG film 418, and the oxidized Si layer 417, and the monocrystalline Si layer 45 is insulatedly separated by the insulating layer 42.

Figure 25:
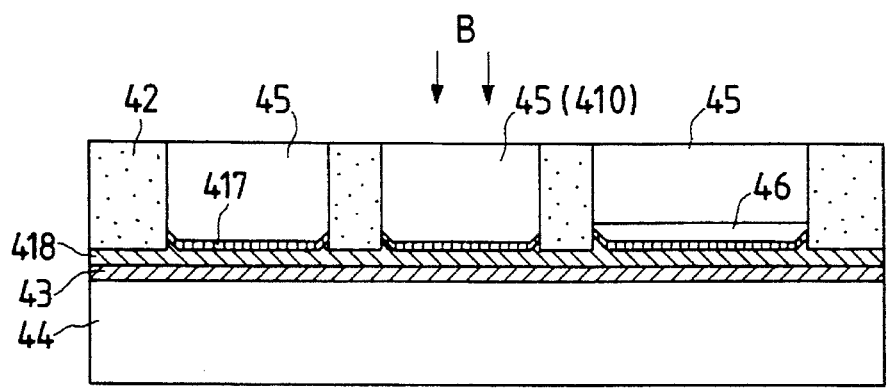

Next, as shown in FIG. 25, a p-type impurity B is introduced into the region of the monocrystalline Si layer where a nMOS transistor is to be formed (the region on the center of FIG. 25), thus a p-well 410 is formed.

Figure 26:
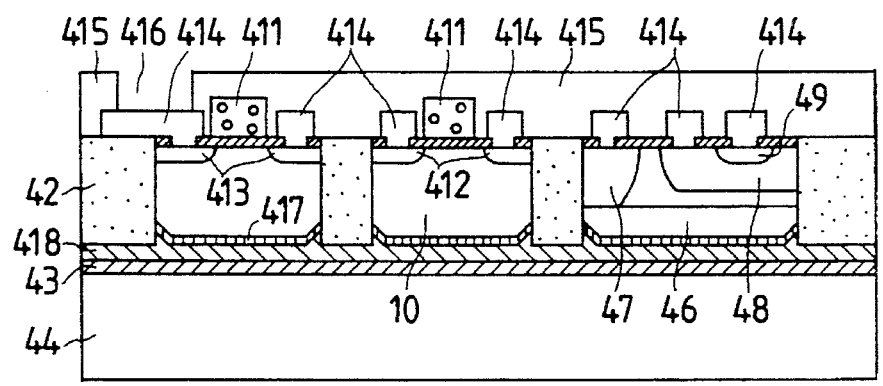

Then, as shown in FIG. 26, impurities are introduced into the region of the monocrystalline Si layer where a NPN transistor is to be formed (the region on the right side of FIG. 25), whereby collector region 47, base region 48 and emitter region 49 are formed to form NPN transistor.

Furthermore, as shown in FIG. 26, thermal oxidation is carried out to form an oxidized Si layer on the surface of the monocrystalline Si layer, and gate 411 is formed from polysilicon on the oxidized Si layer. An n-type impurity As in introduced into the region of the monocrystalline Si layer where nMOS transistor is to be formed (the region on the center of the FIG. 25), to form the source and drain regions 412. Similarly, as shown in FIG. 26, a p-type impurity B is introduced into the region of the monocrystalline Si layer where pMOS transistor is to be formed (the region on the left side of the FIG. 25), to form the source and drain regions 413. Thus, nMOS transistor is formed on the central region and pMOS transistor is formed on the left side region. Then, electrode wirings 414 are formed with Al-Si or the like, furthermore SiN passivation film 415 is deposited and an opening 416 is formed for a bonding pad.

Thus, an excellent-flatness semiconductor device is obtained by insulatedly separating three transistors.

As described above in detail, according to this embodiment, before an insulating surface of a substrate having the insulating surface is bonded to a surface of an insulating layer formed on a surface of a non-porous monocrystalline semiconductor layer or formed thereon, the non-porous monocrystalline semiconductor layer is insulating separated. After bonding to the substrate, a porous semiconductor is removed by etching to obtain a semiconductor substrate having plural excellent-flatness semiconductor regions insulatedly separated. Accordingly, semiconductor substrates and semiconductor devices can be prepared at a low cost without generating surface unevenness as in the case of LOCOS isolation and without complicating step as in the case of Trench isolation.

Furthermore, according to this embodiment, since a porous semiconductor is removed by etching to remain non-porous monocrystalline semiconductor layer on a substrate, high performance semiconductor substrates and semiconductor devices with good productivity, controllability and uniformity are obtained.

EXAMPLE 1

According to the embodiment 1 already mentioned, a p-type (100) monocrystalline silicon substrate A of 200 µm thick (first silicon substrate) was anodized in an HF solution. The conditions for anodization are as follows:

| applied voltage: | 2.6 V |
| --- | --- |
| current density: | 30 mA · cm$^{-2}$ |
| anodizing solution: | HF:H$_2$O:C$_2$H$_5$OH = 1:1:1 |
| time: | 60 seconds |
| thickness of porous silicon: | 2 µm |
| porosity: | 56% |

According to bias sputter method (hereinafter referred to as "BA method"), a silicon epitaxial layer of 0.05 µm thick was grown on the p-type (100) porous silicon substrate.

The conditions for deposition are as follows:

Surface cleaning conditions:

| temperature: | 380° C. |
| --- | --- |
| atmosphere: | Ar |
| pressure: | 15 m Torr |
| substrate potential: | 5 V |
| target potential: | −5 V |
| high-frequency power: | 5 W |
| RF frequency: | 100 MHz |
| Deposition conditions: | |
| RF frequency: | 100 MHz |
| high-frequency power: | 100 W |
| temperature: | 380° C. |
| Ar gas pressure: | 15 m Torr |
| growth time: | 4 minutes |
| film thickness: | 0.05 µm |
| target direct current potential: | −150 V |
| substrate direct current potential: | +10 V |

After resist was applied onto the surface of the grown expitaxial layer, patterning was performed forming 6 mm by 6 mm squares with 100 µm wide scribe lines, using standard photolithographic process, and then grooves were formed by etching the non-porous silicon layer, the porous silicon layer and the silicon substrate, by about 25 µm, with an etching aqueous solution of 49% hydrofluoric acid:concentrated nitric acid:acetic acid=1:3:8.

The resist was removed, and the substrate was subjected to standard substrate cleaning step. A silicon substrate B (second silicon substrate) having a lamination of a nitride layer of 1000 angstroms thick and an oxidized layer of 5000 angstroms thick was superposed upon each other on a surface of the non-porous silicon epitaxial layer. By heating in oxygen atmosphere at 600° C. for 0.5 hour, both of the Si substrates were strongly bonded together.

A portion as thick as about 180 µm of the silicon substrate A was polished away from its back surface in polishing step, and etched grooves which were scribe lines were exposed.

The bonded substrates were wetted, without stirring, in a solution containing 49% hydrofluoric acid, alcohol and 30% aqueous hydrogen peroxide (10:6:50). The porous silicon layer was selectively etched through the etched grooves, lifting off the silicon substrate A.

After 17 hours, only the non-porous monocrystalline silicon layer was left, without being etched, in the form of islands, each 6 mm by 6 mm square, on the oxide film, while both the porous silicon and the silicon substrate A were completely removed.

The etching rate of the non-porous monocrystalline silicon to the etching solution was extremely low, such as 1000 angstroms or less even 17 hours later. The selective ratio of the etching rate of the porous layer to that of the non-porous layer was as large as 10$^5$ or more. The etched amount, as a result of side etching, in the non-porous monocrystalline silicon layer was negligibly small.

As a result as shown in FIG. 12, a non-porous monocrystalline silicon layer 13 of 0.05 µm thickness was formed on the SiO$_2$ 16.

Observing cross-sections of the substrates by means of a transmission electron microscope revealed that the non-porous silicon layer fabricated using the BS method was free from newly introduced crystal defects, while maintaining a good crystallinity. The observation also revealed that an approximately 0.05 µm thick SOI structure was formed.

EXAMPLE 2

A p-type (100) monocrystalline silicon substrate of 200µ thick was anodized in an HF solution.

The conditions for anodization were identical to those used in Example 1.

Using MBE method (Molecular Beam Epitaxy method), a non-porous monocrystalline silicon epitaxial layer of 0.1µ thick was grown on the p-type (100) porous silicon substrate.

The conditions for deposition were as follows:

| temperature: | 700° C. |
| --- | --- |
| pressure: | 1 × 10$^{-9}$ Torr |
| growth rate: | 0.1 nm/second |

After resist was applied onto the surface of the grown expitaxial layer, patterning was performed with 100 µm wide scribe lines with 1 mm spacing between them, using standard photolithographic process, and then grooves were formed by etching the non-porous silicon layer, the porous silicon layer and the silicon substrate, by about 25 µm, with an etching aqueous solution containing 49% hydrofluoric acid:concentrated nitric acid:acetic acid=1:3:8.

The resist was removed, and the substrate was subjected to standard substrate cleaning step. A silicon substrate B having a lamination of a nitride layer of 1000 angstroms thick and an oxidized layer of 5000 angstroms thick was superposed upon each other On the surface of the non-porous silicon epitaxial layer. By heating in oxygen atmosphere at 700° C. for 0.5 hour, both of the silicon substrates were strongly bonded together.

A portion as thick as about 180 µm of the silicon substrate A was polished away from its back surface in polishing step, and etched grooves which were scribe lines were exposed. After that, the bonded substrates were wetted, without stirring, in a mixture solution containing buffered hydrofluoric acid (an aqueous solution of the mixture of 36% ammonium fluoride and 4.5% hydrofluoric acid), alcohol and 30% aqueous hydrogen peroxide (10:6:50). The porous silicon layer was selectively etched through the grooves, lifting off the silicon substrate A.

After 17 hours, the non-porous monocrystalline silicon layer was left, without being etched, in the form of 1 mm wide bands on the oxide film, while both the porous silicon and the silicon substrate A were completely removed.

The etching rate of the non-porous monocrystalline silicon to the etching solution was extremely low, such as 1000 angstroms or less even 17 hours later. The selective ratio of the etching rate of the porous layer to that of the non-porous layer was as large as $10^5$ or more. The etched amount, as a result of side etching, in the non-porous monocrystalline silicon layer was negligibly small.

As a result as shown in FIG. 13, a non-porous monocrystalline silicon layer 13 of 0.1 μm thick was formed on the SiO₂ 16.

Observing cross-sections of the substrates by means of a transmission electron microscope revealed that the silicon layer fabricated using the MBE method was free from newly introduced crystal defects, while maintaining a good crystallinity.

EXAMPLE 3

A p-type (100) monocrystalline silicon substrate of 200μ thick was anodized in an HF solution.

The conditions for anodization were identical to those used in Example 1.

Using plasma CVD method, a silicon epitaxial layer of 0.1μ thick was grown on the p-type (100) porous silicon substrate.

The conditions for deposition were as follows:

| | |
|---|---|
| gas: | SiH₄ |
| high-frequency power: | 100 W |
| temperature: | 800° C. |
| pressure: | $1 \times 10^{-2}$ Torr |
| growth rate: | 2.5 nm/second |

After resist was applied onto the surface of the grown expitaxial layer, patterning was performed forming 6 mm by 6 mm squares with 100 μm wide scribe lines, using standard photolithographic process, and then grooves were formed by etching the non-porous silicon layer, the porous silicon layer and the silicon substrate, by about 25 μm, with an etching aqueous solution containing 49% hydrofluoric acid:concentrated nitric acid:acetic acid=1:3:8.

The resist was removed, and the substrate was subjected to standard substrate cleaning step. A silicon substrate B having a lamination of a nitride layer of 1000 angstroms thick and an oxidized layer of 5000 angstroms thick was superposed upon each other on the surface of the non-porous silicon epitaxial layer. By heating in nitrogen atmosphere at 800° C. for 0.5 hour, both of the silicon substrates were strongly bonded together.

A portion as thick as about 180 μm of the silicon substrate A was polished away from its back surface in polishing step, and etched grooves which were scribe lines were exposed.

After that, the bonded substrates were wetted, with stirring, in a mixture solution containing 49% hydrofluoric acid and 30% aqueous hydrogen peroxide (1:5). The porous silicon layer was selectively etched through the grooves, lifting off the silicon substrate A.

After 17 hours, only the non-porous monocrystalline silicon layer was left, without being etched, in the form of islands, each 6 mm by 6 mm square on the oxide film, while both the porous silicon and the silicon substrate A were completely removed.

The etching rate of the non-porous monocrystalline silicon to the etching solution was extremely low, such as 1000 angstroms or less even 17 hours later. The selective ratio of the etching rate of the porous layer to that of the non-porous layer was as large as $10^5$ or more. The etched amount, as a result of side etching, in the non-porous layer was negligibly small.

As a result, a non-porous monocrystalline silicon layer of 0.1 μm thick was formed on the SiO₂.

Observing cross-sections of the substrates by means of a transmission electron microscope revealed that the non-porous silicon layer fabricated using CVD method was free from newly introduced crystal defects, while maintaining a good crystallinity. The observation also revealed that an approximately 0.1 μm thick SOI structure was formed.

EXAMPLE 4

A p-type (100) monocrystalline silicon substrate of 200μ thick was anodized in an HF solution.

The conditions for anodization were identical to those used in Example 1.

Using liquid-phase epitaxial growth method, a non-porous monocrystalline silicon epitaxial layer of 5μ thick was grown on the p-type (100) porous silicon substrate at a low temperature.

The conditions for epitaxial growth were as follows:

| | |
|---|---|
| solvent medium: | Sn |
| growth temperature: | 900° C. |
| growth atmosphere: | H₂ |
| growth time: | 50 minutes |

After resist was applied onto the surface of the grown expitaxial layer, patterning was performed forming 6 mm by 6 mm squares with 100 μm wide scribe lines, using standard photolithographic process, and then grooves were formed by etching the non-porous silicon layer, the porous silicon layer and the silicon substrate, about 25 μm, with an etching aqueous solution containing 49% hydrofluoric acid:concentrated nitric acid:acetic acid=1:3:8.

The resist was removed, and the substrate was subjected to standard substrate cleaning step. A silicon substrate B having a lamination of a nitride layer of 1000 angstroms thick and an oxidized layer of 5000 angstroms thick was superposed upon on each other on the surface of the non-porous silicon epitaxial layer. By heating in nitrogen atmosphere at 900° C. for 0.5 hour, both of the silicon substrates were strongly bonded together.

A portion as thick as about 190 μm of the silicon substrate A was polished away from its back surface in polishing step, and etched grooves which were scribe lines were exposed.

After that, the bonded substrates were wetted, without stirring, in a mixture solution containing 49% hydrofluoric acid and alcohol (10:1). The porous silicon layer was selectively etched through the grooves, lifting off the silicon substrate A.

After 21 hours, only the non-porous monocrystalline silicon layer was left, without being etched, in the form of islands, each 6 mm by 6 mm square on the nitride film, while both the porous silicon and the silicon substrate A were completely removed.

The etching rate of the non-porous monocrystalline silicon to the etching solution was extremely low, such as 1000 angstroms or less even 21 hours later. The selective ratio of the etching rate of the porous layer to that of the non-porous layer was as large as $10^5$ or more. The etched amount, as a result of side etching, in the non-porous layer was negligibly small. A non-porous monocrystalline silicon layer of 5 μm thick was thus formed on the $SiO_2$.

Observing cross-sections of the substrates by means of a transmission electron microscope revealed that the non-porous silicon layer fabricated using the liquid-phase epitaxial growth method was free from newly introduced crystal defects, while maintaining a good crystallinity. The observation also revealed that an approximately 5 μm thick SOI structure was formed.

EXAMPLE 5

An n-type (100) monocrystalline silicon substrate of 200μ thick was anodized in an HF solution.

The conditions for anodization were identical to those used in Example 1.

Using low pressure CVD method, a silicon epitaxial layer of 0.1μ thick was grown on the p-type (100) porous silicon substrate.

The conditions for deposition were as follows:

| | |
|---|---|
| source gas: | $SiH_4$ |
| carrier gas: | $H_2$ |
| temperature: | 850° C. |
| pressure: | $1 \times 10^{-2}$ Torr |
| growth rate: | 3.3 nm/second |

After resist was applied onto the surface of the grown expitaxial layer, patterning was performed forming 6 mm by 6 mm squares with 100 μm wide scribe lines, using standard photolithographic process, and then grooves were formed by etching about 25 μm of the non-porous silicon layer, the porous silicon layer and the silicon substrate with an etching aqueous solution containing 49% hydrofluoric acid:concentrated nitric acid:acetic acid=1:3:8.

The resist was removed, and the substrate was subjected to standard substrate cleaning step. A silicon substrate B having a lamination of a nitride layer of 1000 angstroms thick and an oxidized layer of 5000 angstroms thick was superposed upon each other on the surface of the non-porous silicon epitaxial layer. By heating in oxygen atmosphere at 800° C. for 0.5 hour, both of the silicon substrates were strongly bonded together.

A portion as thick as about 180 μm of the silicon substrate A was polished away from its back surface in polishing step, and etched grooves which were scribe lines were exposed.

After that, the bonded substrates were dipped with stirring, in a solution of 49% hydrofluoric acid. The porous silicon layer was selectively etched through the grooves, lifting off the silicon substrate A.

After 20 hours, only the non-porous monocrystalline silicon layer was left, without being etched, in the form of islands, each 6 mm by 6 mm square on the oxide film, while both the porous silicon and the silicon substrate A were completely removed.

The etching rate of the non-porous monocrystalline silicon to the etching solution was extremely low, such as 1000 angstroms or less even 20 hours later. The selective ratio of the etching rate of the porous layer to that of the non-porous layer was as large as $10^5$ or more. The etched amount, as a result of side etching, in the non-porous layer was negligibly small.

As a result, a non-porous monocrystalline silicon layer of 0.1 μm thick was formed on the $SiO_2$.

Observing cross-sections of the substrates by means of a transmission electron microscope revealed that the non-porous silicon layer fabricated using low pressure CVD method was free from newly introduced crystal defects, while maintaining a good crystallinity. The observation also revealed that an approximately 0.1 μm thick SOI structure was formed.

EXAMPLE 6

A p-type (100) monocrystalline silicon substrate of 200μ thick was anodized in an HF solution.

The conditions for anodization were identical to those used in Example 1.

Using CVD method, a silicon epitaxial layer of 2μ thick was grown on the p-type (100) porous silicon substrate.

The conditions for deposition were as follows:

| | |
|---|---|
| temperature: | 900° C. |
| $H_2$: | 150 l/minute |
| $SiH_2Cl_2$: | 1 l/minute |
| pressure: | 80 Torr |
| growth time: | 5 minutes |
| film thickness: | 2 μm |

After resist was applied onto the surface of the grown expitaxial layer, patterning was performed with 100 μm wide scribe lines with 1 mm spacing between them, using standard photolithographic process, and then grooves were formed by etching the non-porous silicon layer, the porous silicon layer and the silicon substrate, by about 25 μm, with an etching aqueous solution containing 49% hydrofluoric acid:concentrated nitric acid:acetic acid=1:3:8.

The resist was removed, and the substrate was subjected to standard substrate cleaning step. A silicon substrate B having a lamination of a nitride layer of 1000 angstroms thick and an oxidized layer of 5000 angstroms thick was superposed upon each other on the surface of the non-porous silicon epitaxial layer. By heating in oxygen atmosphere at 600° C. for 0.5 hour, both of the silicon substrates were strongly bonded together.

A portion as thick as about 180 μm of the silicon substrate A was polished away from its back surface in polishing step, and etched grooves which were scribe lines were exposed.

After that, the bonded substrates were wetted, without stirring, in a solution containing buffered hydrofluoric acid (an aqueous solution of the mixture of 36% ammonium fluoride and 4.5 hydrofluoric acid), and alcohol (10:1). The porous silicon layer was selectively etched through the grooves, lifting off the silicon substrate A.

After 23 hours, only the non-porous monocrystalline silicon layer was left, without being etched, in the form of 1 mm wide bands on the oxide film, while both the porous silicon and the silicon substrate A were completely removed.

The etching rate of the non-porous monocrystalline silicon to the etching solution was extremely low, such as 1000 angstroms or less even 23 hours later. The selective ratio of the etching rate of the porous layer to that of the non-porous layer was as large as $10^5$ or more. The etched amount, as a result of side etching, in the non-porous layer was negligibly small. A non-porous monocrystalline silicon layer of 2 μm thickness was formed on the $SiO_2$.

Observing cross-sections of the substrates by means of a transmission electron microscope revealed that the silicon layer fabricated using CVD method was free from newly introduced crystal defects, while maintaining a good crystallinity.

EXAMPLE 7

A p-type (100) monocrystalline silicon substrate of 200μ thick was anodized in an HF solution.

The conditions for anodization were identical to those used in Example 1.

Using CVD method, a silicon epitaxial layer of 2 μm thick was grown on the p-type (100) porous silicon substrate.

The conditions for deposition were as follows:

| | |
|---|---|
| temperature: | 900° C. |
| $H_2$: | 150 l/minute |
| $SiH_2Cl_2$: | 1 l/minute |
| pressure: | 80 Torr |
| growth time: | 5 minutes |
| film thickness: | 2 μm |

After resist was applied onto the surface of the grown expitaxial layer, patterning was performed with 100 μm wide scribe lines with 1 mm spacing between them, using standard photolithographic process, and then grooves were formed by etching the non-porous silicon layer, the porous silicon layer and the silicon substrate, by about 25 μm, with an etching aqueous solution containing 49% hydrofluoric acid:concentrated nitric acid:acetic acid=1:3:8.

The resist was removed, and the substrate was subjected to standard substrate cleaning step. A silicon substrate B made of an oxidized layer of 5000 angstroms thick was superposed upon each other on the surface of the non-porous silicon epitaxial layer. By heating in oxygen atmosphere at 600° C. for 0.5 hour, both of the silicon substrates were strongly bonded together.

A portion as thick as about 180 μm of the silicon substrate A was polished away from its back surface in polishing step, and etched grooves which were scribe lines were exposed.

After that, the bonded substrates were dipped with stirring, in a solution containing buffered hydrofluoric acid (an aqueous solution of the mixture of 36% ammonium fluoride and 4.5% hydrofluoric acid) and 30% aqueous hydrogen peroxide (1:5). The porous silicon layer was selectively etched through the grooves, lifting off the silicon substrate A.

After 16 hours, only the non-porous monocrystalline silicon layer was left, without being etched, in the form of 1 mm wide bands on the oxide film, while both the porous silicon and the silicon substrate A were completely removed. The etching rate of the non-porous monocrystalline silicon to the etching solution was extremely low, such as 1000 angstroms or less even 16 hours later. The selective ratio of the etching rate of the porous layer to that of the non-porous layer was as large as $10^5$ or more. The etched amount, as a result of side etching, in the non-porous layer was negligibly small.

As a result, a non-porous monocrystalline silicon layer of 2 μm thick was formed on the $SiO_2$.

Observing cross-sections of the substrates by means of a transmission electron microscope revealed that the silicon layer fabricated using CVD method was free from newly introduced crystal defects, while maintaining a good crystallinity.

EXAMPLE 8

A p-type (100) monocrystalline silicon substrate of 200μ thick was anodized in an HF solution.

The conditions for anodization were identical to those used in Example 1.

Using CVD method, a silicon epitaxial layer of 2 μm thick was grown on the p-type (100) porous silicon substrate.

The conditions for deposition were as follows:

| | |
|---|---|
| temperature: | 900° C. |
| $H_2$: | 150 l/minute |
| $SiH_2Cl_2$: | 1 l/minute |
| pressure: | 80 Torr |
| growth time: | 5 minutes |
| film thickness: | 2 μm |

After resist was applied onto the surface of the grown expitaxial layer, patterning was performed with 100 μm wide scribe lines with 1 mm spacing between them, using standard photolithographic process, and then grooves were formed by etching the non-porous silicon layer, the porous silicon layer and the silicon substrate, by about 25 μm, with an etching aqueous solution containing 49% hydrofluoric acid:concentrated nitric acid:acetic acid=1:3:8.

The resist was removed, and the substrate was subjected to standard substrate cleaning step. A silicon substrate B having a lamination of a nitride layer of 1000 angstroms thick and an oxidized layer of 5000 angstroms thick was superposed upon each other on the surface of the non-porous silicon epitaxial layer. By heating in oxygen atmosphere at 600° C. for 0.5 hour, both of the silicon substrates were strongly bonded together.

A portion as thick as about 180 μm of the silicon substrate A was polished away from its back surface polishing step, and etched grooves which were scribe lines were exposed.

After that, only the bonded substrates were dipped with stirring, in a solution of buffered hydrofluoric acid (an aqueous solution of the mixture of 36% ammonium fluoride and 4.5% hydrofluoric acid). The porous silicon layer was selectively etched through the grooves, lifting off the silicon substrate A.

After 22 hours, only the non-porous monocrystalline silicon layer was left, without being etched, in the form of 1 mm wide bands on the oxide film, while both the porous silicon and the silicon substrate A were completely removed.

The etching rate of the non-porous monocrystalline silicon to the etching solution was extremely low, such as 1000 angstroms or less even 22 hours later. The selective ratio of the etching rate of the porous layer to that of the non-porous layer was as large as $10^5$ or more. The etched amount, as a result of side etching, in the non-porous layer was negligibly small.

As a result, a non-porous monocrystalline silicon layer of 2 μm thick was formed on the $SiO_2$.

Observing cross-sections of the substrates by means of a transmission electron microscope revealed that the non-porous silicon layer fabricated using CVD method was free from newly introduced crystal defects, while maintaining a good crystallinity.

To produce, on an insulator layer, a silicon layer of which crystallinity is as excellent as that of monocrystalline wafer, Examples 1 through 8 described in detail above offer a particularly excellent method from the standpoint of productivity, uniformity, controllability, and economy.

Since forming grooves allows the same insulator substrate to be provided on it with a plurality of dielectrically isolated crystalline islands which exhibit a crystallinity as excellent as that of a monocrystalline wafer, a substantial improvement is achieved in productivity, uniformity, controllability and economy factor, particularly when a plurality of dielectrically isolated electronic devices are formed on a common substrate.

Employed in etching a porous silicon may be a wet chemical etching solution which does not adversely affect the semiconductor process, and the selective ratio of the etching rate of the porous silicon to that of the non-porous silicon is as large as $10^5$ or more; thus, dramatic improvement is achieved in controllability and productivity.

EXAMPLE 9

A p-type (100) monocrystalline silicon substrate of 200μ thick was anodized in a 50% HF solution. Current density used then was 30 mA/cm$^2$, and an approximately 2 μm thick porous silicon layer was formed on the p-type silicon substrate in a duration of 60 seconds.

Using a Bias Sputter method, a non-porous monocrystalline silicon epitaxial layer of 0.05 μm thick was grown on the porous silicon layer of the p-type (100) silicon substrate at a low temperature.

The conditions for deposition are as follows:

Cleaning of substrate surface

| | |
|---|---|
| RF frequency: | 100 MHz |
| high-frequency power: | 5 W |
| temperature: | 380° C. |
| Ar gas pressure: | 15 × 10$^{-3}$ Torr |
| cleaning time: | 5 minutes |
| target direct current bias: | −5 V |
| substrate direct current bias: | +5 V |

Film formation

| | |
|---|---|
| RF frequency: | 100 MHz |
| high-frequency power: | 100 W |
| temperature: | 380° C. |
| Ar gas pressure: | 15 × 10$^{-3}$ Torr |
| growth time: | 3 minutes |
| grown film thickness: | 0.05 μm |
| target direct current bias: | −150 V |
| substrate direct current bias: | +10 V |

After a resist was applied onto the surface of the grown expitaxial layer, patterning was performed forming 6 mm by 6 mm squares with 100 μm wide scribe lines, using standard photolithographic process, and then grooves were formed by etching the non-porous silicon layer, the porous silicon layer and the silicon substrate, by about 25 μm, with an etching aqueous solution containing 49% hydrofluoric acid:concentrated nitric acid:acetic acid=1:3:8.

The resist was removed, and the substrate was subjected to standard substrate cleaning step. A glass substrate having a softening point of about 500° C., subjected to optical polishing was superposed upon each other on the surface of the non-porous monocrystalline silicon layer. By heating in oxygen atmosphere at 450° C. for 0.5 hour, both substrates were strongly bonded together.

Next, using plasma CVD method, a 0.1 μm thick Si$_3$N$_4$ layer as a etching stopper was deposited to cover the two bonded substrates.

A portion as thick as about 180 μm of the silicon substrate A was polished away from its back surface in polishing step, and etched grooves which were scribe lines were exposed. The bonded substrates were wetted, without stirring, in a solution containing 49% hydrofluoric acid, an alcohol and 30% aqueous hydrogen peroxide (10:6:50). The porous silicon layer was selectively etched through the grooves, lifting off the silicon substrate.

After 17 hours, the non-porous monocrystalline silicon layer was left, without being etched, in the form of islands, each 6 mm by 6 mm square, on the fused silica glass substrate, while both the porous silicon layer and the silicon substrate were completely removed.

The etching rate of the non-porous monocrystalline silicon to the etching solution was extremely low, such as 1000 angstroms or less even 17 hours later. The selective ratio of the etching rate of the porous layer to that of the non-porous layer was as large as $10^5$ or more. The etched amount, as a result of side etching, in the non-porous layer was negligibly small.

As shown in the perspective view of FIG. 15, with the Si$_3$N$_4$ layer removed, a 0.05 μm thick monocrystalline silicon layer 13 was formed on the fused silica glass 15.

As an alternative to the Si$_3$N$_4$ layer, Apiezon wax or electron wax may be employed for covering, providing equivalent meritorious effects: porous silicon layer only may be removed.

Observing cross-sections of the substrates by means of a transmission electron microscope revealed that the silicon layer fabricated using the BS method was free from newly introduced crystal defects, while maintaining a good crystallinity. The observation also revealed that an approximately 0.05 μm thick SOI structure was formed.

EXAMPLE 10

A p-type (100) monocrystalline silicon substrate of 200μ thick was anodized in a 50% HF solution. Current density used then was 10 mA/cm$^2$, and an approximately 5000 angstroms thick porous silicon layer was formed on the p-type silicon substrate.

Using MBE method (Molecular Beam Epitaxy method), a silicon epitaxial layer of 0.1μ thick was grown on the porous silicon layer at a low temperature.

The conditions for deposition were as follows:

| | |
|---|---|
| temperature: | 700° C. |
| pressure: | 1 × 10$^{-9}$ Torr |
| growth rate: | 0.1 nm/second |

After resist was applied onto the surface of the grown expitaxial layer, patterning was performed with 100 μm wide scribe lines with 1 mm spacing between them, using standard photolithographic process, and then grooves were formed by etching the non-porous silicon layer, the porous silicon layer and the silicon substrate, by about 25 μm, with an etching aqueous solution containing 49% hydrofluoric acid:concentrated nitric acid:acetic acid=1:3:8.

The resist was removed, and the substrate was subjected to standard substrate cleaning step. A fused silica glass substrate subjected to optical polishing was placed on the surface of the non-porous monocrystalline silicon layer. By heating in oxygen atmosphere at 700° C. for 0.5 hour, both substrates were strongly bonded together.

Next, using plasma CVD mothod, a 0.1 µm thick $Si_3N_4$ layer was deposited to cover the two bonded substrates.

A portion as thick as about 180 µm of the silicon substrate was polished away from its back surface in polishing step, and etched grooves which were scribe lines were exposed. After that, the bonded substrates were wetted, without stirring, in a mixture solution containing 49% hydrofluoric acid, an alcohol and 30% aqueous hydrogen peroxide (10:6:50). The porous silicon layer was selectively etched through the grooves, lifting off the silicon substrate A.

After 9 hours, the non-porous monocrystalline silicon layer was left, without being etched, in the form of 1 mm wide bands on the fused silica glass substrate, while both the porous silicon layer and the silicon substrate were completely removed.

The etching rate of the non-porous monocrystalline silicon to the etching solution was extremely low, such as 1000 angstroms or less even 9 hours later. The selective ratio of the etching Fate of the porous layer to that of the non-porous layer was as large as $10^5$ or more. The etched amount, as a result of side etching, in the non-porous layer was negligibly small.

As shown in the perspective view of FIG. 16, with the $Si_3N_4$ layer removed, a 0.1 µm thick monocrystalline silicon layer was formed on the fused silica glass substrate.

As an alternative to the $Si_3N_4$ layer, Apiezon wax or electron wax may be employed for covering to provide equivalent meritorious effects and only silicon layer which is made porous may be removed.

Observing cross-sections of the substrates by means of a transmission electron microscope revealed that the non-porous silicon layer fabricated using MBE method was free from newly introduced crystal defects, while maintaining a good crystallinity. The observation also revealed that an approximately 0.1 µm thick SOI structure was formed.

EXAMPLE 11

A p-type (100) monocrystalline silicon substrate of 200µ thick was anodized in a 50% HF solution. Current density used then was 10 mA/cm², and an approximately 5000 angstroms thick porous silicon layer was formed on the p-type silicon substrate.

Using plasma CVD method, a silicon epitaxial layer of 0.1 µm was grown on the porous silicon layer of the p-type (100) silicon substrate at a low temperature.

The conditions for deposition were as follows:

| | |
|---|---|
| gas: | $SiH_4$ |
| high-frequency power: | 100 W |
| temperature: | 800° C. |
| pressure: | $1 \times 10^{-2}$ Torr |
| growth rate: | 2.5 nm/second |

After resist was applied onto the surface of the grown expitaxial layer, patterning was performed forming 100 µm wide scribe lines with 1 mm spacing between them, using standard photolithographic process, and then grooves were formed by etching the non-porous silicon layer, the porous silicon layer and the silicon substrate, by about 25 µm, with an etching aqueous solution containing 49% hydrofluoric acid:concentrated nitric acid:acetic acid=1:3:8.

The resist was removed, and the substrate was subjected to standard substrate cleaning step. A fused silica glass substrate subjected to optical polishing was placed on the surface of the non-porous monocrystalline silicon layer. By heating in nitrogen atmosphere at 800° C. for 0.5 hour, both substrates were strongly bonded together.

Next, using plasma CVD method, a 0.1 µm thick $Si_3N_4$ layer was deposited to cover the two bonded substrates.

A portion as thick as about 180 µm of the silicon substrate was polished away from its back surface in polishing step, and etched grooves which were scribe lines were exposed. After that, the bonded substrates were dipped with stirring, in a solution containing 49% hydrofluoric acid and 30% aqueous hydrogen peroxide (1:5). The porous silicon layer was selectively etched through the grooves, lifting off the silicon substrate.

After 160 minutes, only the non-porous monocrystalline silicon layer was left, without being etched, in the form of 1 mm wide bands on the fused silica glass substrate, while both the porous silicon and the silicon substrate were completely removed.

The etching rate of the non-porous monocrystalline silicon to the etching solution was extremely low, such as 1000 angstroms or less even 3 hours later. The selective ratio of the etching rate of the porous layer to that of the non-porous layer was as large as $10^5$ or more. The etched amount, as a result of side etching, in the non-porous layer was negligibly small.

With the $Si_3N_4$ layer removed, a 0.1 µm thick monocrystalline silicon layer was formed on the fused silica glass substrate.

As an alternative to the $Si_3N_4$ layer, Apiezon wax or electron wax may be employed for covering to provide equivalent meritorious effects and only silicon layer which was made porous may be removed.

Observing cross-sections of the substrates by means of a transmission electron microscope revealed that the silicon layer fabricated using plasma CVD method was free from newly introduced crystal defects, while maintaining a good crystallinity. The observation also revealed that an approximately 0.1 µm thick SOI structure was formed.

EXAMPLE 12

A p-type (100) monocrystalline silicon substrate of 200µ thick was anodized in a 50% HF solution. Current density used then was 10 mA/cm², and an approximately 5000 angstroms thick porous silicon layer was formed on the silicon substrate.

Using liquid-phase growth method, a silicon epitaxial layer of 0.5µ thick was grown on the porous silicon layer of the p-type (100) silicon substrate at a low temperature.

The conditions for growth were as follows:

| | |
|---|---|
| solvent: | Sn |
| growth temperature: | 900° C. |
| growth atmosphere: | $H_2$ |
| growth time: | 5 minutes |

After resist was applied onto the surface of the grown expitaxial layer, patterning was performed forming 6 mm by 6 mm squares with 100 μm wide scribe lines, using standard photolithographic process, and then grooves were formed by etching the non-porous silicon layer, the porous silicon layer and the silicon substrate, by about 25 μm, with an etching aqueous solution containing 49% hydrofluoric acid:concentrated nitric acid:acetic acid=1:3:8.

The resist was removed, and the substrate was subjected to standard substrate cleaning step. A fused silica glass substrate subjected to optical polishing was placed on the surface of the non-porous monocrystalline silicon layer. By heating in nitrogen atmosphere at 900° C. for 0.5 hour, both of the silicon substrates were strongly bonded together.

Next, using plasma CVD method, a 0.1 μm thick $Si_3N_4$ layer was deposited to cover the two bonded substrates.

A portion as thick as about 180 μm of the silicon substrate was polished away from its back surface in polishing step, and etched grooves which were scribe lines were exposed. After that, the bonded substrates were wetted, without stirring, in a mixture solution containing 49% hydrofluoric acid and alcohol (10:1). The porous silicon layer was selectively etched through the grooves, lifting off the silicon substrate.

After 21 hours, the non-porous monocrystalline silicon layer was left, without being etched, in the form of islands, each 6 mm by 6 mm square on the fused silica glass substrate, while both the porous silicon and the silicon substrate were completely removed.

The etching rate of the non-porous monocrystalline silicon to the etching solution was extremely low, such as 1000 angstroms or less even 21 hours later. The selective ratio of the etching rate of the porous layer to that of the non-porous layer was as large as $10^5$ or more. The etched amount, as a result of side etching, in the non-porous layer was negligibly small.

With the $Si_3N_4$ layer removed, a 5 μm thick monocrystalline silicon layer was formed on the fused silica glass substrate.

As an alternative to the $Si_3N_4$ layer, Apiezon wax or electron wax may be employed for covering to provide equivalent meritorious effects and only silicon layer which was made porous may be removed.

Observing cross-sections of the substrates by means of a transmission electron microscope revealed that the non-porous silicon layer fabricated using liquid-phase growth method was free from newly introduced crystal defects, while maintaining a good crystallinity. The observation also revealed that an approximately 5 μm thick SOI structure was formed.

EXAMPLE 13

An n-type (100) monocrystalline silicon substrate of 200μ thick was anodized in a 50% HF solution. Current density used then was 30 mA/cm$^2$, and an approximately 2 μm thick porous silicon layer was formed on the surface of the n-type silicon substrate for 60 seconds.

Using low pressure CVD method, a silicon epitaxial layer of 0.5μ thick was grown on the porous silicon layer of the n-type (100) silicon substrate at a low temperature.

The conditions for deposition were as follows:

| | | |
|---|---|---|
| source gas: | $SiH_4$ | 800 SCCM |
| carrier gas: | $H_2$ | 150 l/minute |
| temperature: | 850° C. | |
| pressure: | $1 \times 10^{-2}$ Torr | |
| growth rate: | 3.3 nm/second | |

After resist was applied onto the surface of the grown expitaxial layer, patterning was performed forming 6 mm by 6 mm squares with 100 μm wide scribe lines, using standard photolithographic process, and then grooves were formed by etching the non-porous silicon layer, the porous silicon layer and the silicon substrate, by about 25 μm, with an etching aqueous solution containing 49% hydrofluoric acid:concentrated nitric acid:acetic acid=1:3:8.

The resist was removed, and the substrate was subjected to standard substrate cleaning step. A fused silica glass substrate subjected to optical polishing was placed on the surface of the non-porous monocrystalline silicon layer. By heating in oxygen atmosphere at 800° C. for 0.5 hour, both substrates were strongly bonded together.

Next, using plasma CVD method, a 0.1 μm thick $Si_3N_4$ layer was deposited to cover the two bonded substrates.

A portion as thick as about 180 μm of the silicon substrate was polished away from its back surface using lapping technique, and etched grooves which were scribe lines were exposed. After that, the bonded substrates were dipped with stirring, in a solution of 49% hydrofluoric acid. The porous silicon layer was selectively etched through the grooves, to lift off the silicon substrate.

After 20 hours, only the non-porous monocrystalline silicon layer was left, without being etched, in the form of islands, each 6 mm by 6 mm square on the fused silica glass substrate, while both the porous silicon and the silicon substrate were completely removed.

The etching rate of the non-porous monocrystalline silicon to the etching solution was extremely low, such as 1000 angstroms or less even 20 hours later. The selective ratio of the etching rate of the porous layer to that of the non-porous layer was as large as $10^5$ or more. The etched amount, as a result of side etching, in the non-porous layer was negligibly small.

After the $Si_3N_4$ layer removed, a 0.1 μm thick monocrystalline silicon layer was formed on the fused silica glass substrate.

As an alternative to the $Si_3N_4$ layer, Apiezon wax or electron wax may be employed for covering, providing equivalent meritorious effects: porous silicon layer only may be removed.

Observing cross-sections of the substrates by means of a transmission electron microscope revealed that the silicon layer fabricated using low pressure CVD method was free from newly introduced crystal defects, while maintaining a good crystallinity. The observation also revealed that an approximately 0.1 μm thick SOI structure was formed.

EXAMPLE 14

A p-type (100) monocrystalline silicon substrate of 200μ thick was anodized in a 50% HF solution. Current density used then was 30 mA/cm$^2$, and an approximately 2 μm thick porous silicon layer was formed on the p-type silicon substrate in a duration of 60 seconds.

Using CVD method, a non-porous monocrystalline silicon epitaxial layer of 2μ thick was grown on the porous silicon layer on the p-type (100) silicon substrate under low temperature.

The conditions for deposition were as follows:

| substrate temperature: | 900° C. | |
|---|---|---|
| carrier gas: | $H_2$ | 150 l/minute |
| source gas: | $Si_2Cl_2$ | 1 l/minute |
| pressure: | 80 Torr | |
| growth time: | 5 minutes | |

After resist was applied onto the surface of the grown expitaxial layer, patterning was performed with 100 μm wide scribe lines with 1 mm spacing between them, using standard photolithographic process, and then grooves were formed by etching the non-porous Si monocrystalline layer, the porous Si layer and the silicon substrate, by about 25 μm, with an etching aqueous solution containing 49% hydrofluoric acid, concentrated nitric acid and acetic acid (1:3:8).

The resist was removed, and the substrate was subjected to standard substrate cleaning step. A fused silica glass substrate subjected to optical polishing was placed on the surface of the non-porous monocrystalline silicon layer. By heating in oxygen atmosphere at 600° C. for 0.5 hour, both substrates were strongly bonded together.

Next, using plasma enhanced CVD method, a 0.1 μm thick $Si_3N_4$ layer was deposited to cover the two bonded substrates.

A portion as thick as about 180 μm of the silicon substrate was polished away from its back surface in polishing step, and etched grooves which were scribe lines were exposed. After that, the bonded substrates were dipped without stirring, in a solution containing 10 parts BHF (an aqueous solution of the mixture of 36% ammonium fluoride and 4.5% hydrofluoric acid) and 1 part alcohol. The porous silicon layer was selectively etched through the grooves to lift off the silicon substrate.

After 12 hours, the non-porous monocrystalline silicon layer was left, without being etched, in the form of 1 mm wide bands on the fused silica glass substrate, while both the porous silicon and the silicon substrate were completely removed.

The etching rate of the non-porous monocrystalline silicon to the etching solution was extremely low, such as 1000 angstroms or less even 12 hours later. The selective ratio of the etching rate of the porous layer to that of the non-porous layer was as large as $10^5$ or more. The etched amount, as a result of side etching, in the non-porous layer was negligibly small.

After the $Si_3N_4$ layer removed, a 2 μm thick monocrystalline silicon layer was formed on the fused silica glass substrate.

As an alternative to the $Si_3N_4$ layer, Apiezon wax or electron wax may be employed for covering, providing equivalent meritorious effects:porous silicon layer only may be removed.

Observing cross-sections of the substrates by means of a transmission electron microscope revealed that the non-porous silicon layer fabricated using CVD method was free from newly introduced crystal defects, while maintaining a good crystallinity. The observation also revealed that an approximately 2 μm thick SOI layer was formed.

EXAMPLE 15

A p-type (100) monocrystalline silicon substrate of 200μ thick was anodized in a 50% HF solution. Current density used then was 30 mA/cm$^2$, and an approximately 2 μm thick porous silicon layer was formed on the p-type silicon substrate in a duration of 60 seconds.

Using CVD method, a non-porous monocrystalline silicon epitaxial layer of 2μ thick was grown on the porous silicon layer on the p-type (100) silicon substrate under low temperature.

The conditions for deposition were as follows:

| substrate temperature: | 900° C. | |
|---|---|---|
| carrier gas: | $H_2$ | 150 l/minute |
| source gas: | $Si_2Cl_2$ | 1 l/minute |
| pressure: | 80 Torr | |
| growth time: | 5 minutes | |

After resist was applied onto the surface of the grown expitaxial layer, patterning was performed with 100 μm wide scribe lines with 1 mm spacing between them, using standard photolithographic process, and then grooves were formed by etching the non-porous Si monocrystalline layer, the porous Si layer and the silicon substrate, by about 25 μm, with an etching aqueous solution containing 49% hydrofluoric acid, concentrated nitric acid and acetic acid (1:3:8).

The resist was removed, and the substrate was subjected to standard substrate cleaning step. A fused silica glass substrate subjected to optical polishing was placed on the surface of the non-porous monocrystalline silicon layer. By heating in oxygen atmosphere at 600° C. for 0.5 hour, both substrates were strongly bonded together.

Next, using plasma enhanced CVD method, a 0.1 μm thick $Si_3N_4$ layer was deposited to cover the two bonded substrates.

A portion as thick as about 180 μm of the silicon substrate was polished away from its back surface in polishing step, and etched grooves which were scribe lines were exposed. After that, the bonded substrates were dipped with stirring, in a solution containing 1 part BHF (an aqueous solution of the mixture of 36% ammonium fluoride and 4.5% hydrofluoric acid) and 5 parts 30% aqueous hydrogen peroxide. The porous silicon layer was selectively etched through the grooves to lift off the silicon substrate.

After 8 hours, only the non-porous monocrystalline silicon layer was left, without being etched, in the form of 1 mm wide bands on the fused silica glass substrate, while both the porous silicon and the silicon substrate were completely removed.

The etching rate of the non-porous monocrystalline silicon to the etching solution was extremely low, such as 1000 angstroms or less even 8 hours later. The selective ratio of the etching rate of the porous layer to that of the non-porous layer was as large as $10^5$ or more. The etched amount, as a result of side etching, in the non-porous layer was negligibly small.

After the $Si_3N_4$ layer removed, a 2 μm thick monocrystalline silicon layer was formed on the fused silica glass substrate.

As an alternative to the $Si_3N_4$ layer, Apiezon wax or electron wax may be employed for covering, providing equivalent meritorious effects: porous silicon layer only may be removed.

Observing cross-sections of the substrates by means of a transmission electron microscope revealed that the silicon layer fabricated using CVD method was free from newly introduced crystal defects, while maintaining a good crystallinity. The observation also revealed that an approximately 2 μm thick SOI was formed.

EXAMPLE 16

A p-type (100) monocrystalline silicon substrate of 200μ thick was anodized in a 50% HF solution. Current density used then was 30 mA/cm², and an approximately 2 μm thick porous silicon layer was formed on the p-type silicon substrate in a duration of 60 seconds.

Using plasma CVD method, a non-porous monocrystalline silicon epitaxial layer of 2μ thick was grown on the porous silicon layer on the p-type (100) silicon substrate.

The conditions for deposition were as follows:

| substrate temperature: | 900° C. | |
|---|---|---|
| carrier gas: | H₂ | 150 l/minute |
| Source gas: | Si₂Cl₂ | 1 l/minute |
| pressure: | 80 Torr | |
| growth time: | 5 minutes | |

After resist was applied onto the surface of the grown expitaxial layer, patterning was performed with 100 μm wide scribe lines with 1 mm spacing between them, using standard photolithographic process, and then grooves were formed by etching the non-porous silicon layer, the porous silicon layer and the silicon substrate, by about 25 μm, with an etching aqueous solution containing 49% hydrofluoric acid, concentrated nitric acid and acetic acid (1:3:8).

The resist was removed, and the substrate was subjected to standard substrate cleaning step. A fused silica glass substrate subjected to optical polishing was placed on the surface of the non-porous monocrystalline silicon layer. By heating in oxygen atmosphere at 600° C. for 0.5 hour, both substrates were strongly bonded together.

Next, using plasma enhanced CVD method, a 0.1 μm thick Si₃N₄ layer was deposited to cover the two bonded substrates.

A portion as thick as about 180 μm of the silicon substrate was polished away from its back surface in polishing step, and etched grooves which were scribe lines were exposed. After that, the bonded substrates were dipped with stirring, in a solution of BHF (an aqueous solution of the mixture of 36% ammonium fluoride and 4.5% hydrofluoric acid). The porous silicon layer was selectively etched through the grooves to lift off the silicon substrate.

After 11 hours, only the non-porous monocrystalline silicon layer was left, without being etched, in the form of 1 mm wide bands on the oxide film, while both the porous silicon and the silicon substrate were completely removed.

The etching rate of the non-porous monocrystalline silicon to the etching solution was extremely low, such as 1000 angstroms or less even 11 hours later. The selective ratio of the etching rate of the porous layer to that of the non-porous layer was as large as 10⁵ or more. The etched amount, as a result of side etching, in the non-porous layer was negligibly small.

After the Si₃N₄ layer removed, a 2 μm thick monocrystalline silicon layer was formed on the fused silica glass substrate.

As an alternative to the Si₃N₄ layer, Apiezon wax or electron wax may be employed for covering, providing equivalent meritorious effects: porous silicon layer only may be removed.

Observing cross-sections of the substrates by means of a transmission electron microscope revealed that the non-porous silicon layer fabricated using CVD method was free from newly introduced crystal defects, while maintaining a good crystallinity. The observation also revealed that an approximately 2 μm thick SOI structure was formed.

To produce, on a light-transmissive insulator layer typically such as a glass substrate, a silicon layer of which crystallinity is as excellent as that of monocrystalline wafer, Examples 9 through 16 described in detail above offer a particularly excellent method from the standpoint of productivity, uniformity, controllability, and economy.

Since by forming grooves the same insulator substrate can be provided on it with a plurality of dielectrically isolated crystal islands which exhibit a crystallinity as excellent as that of a monocrystalline wafer, a substantial improvement is achieved in productivity, uniformity, controllability and economy factor, particularly when a plurality of dielectrically isolated electronic devices are formed on a common substrate.

In etching a porous silicon it is possible to use a wet chemical etching solution which does not adversely affect the semiconductor process, and the selective ratio of the etching rate of the porous silicon to that of the non-porous silicon is as large as 10⁵ or more; thus, dramatic improvement is achieved in controllability and productivity.

EXAMPLE 17

Example 17 of the present invention is described below.

Referring to process drawings in FIGS. 19A to 19E, Example 17 is described.

An n-type silicon layer 32 was subjected to implantation of boron ions of 1×10¹⁴–1×10¹⁶ and then subjected to heat treatment to form a substrate. This substrate was anodized in a 50% HF solution. The current density then was 100 mA/cm². The porosity forming rate then was 8.4 μm/minute The entire p-type (100) silicon layer 31 of 10μ thick became porous in a duration of 2 minutes. As already described, in this anodization process, the p-type (100) silicon layer 31 only became porous, with the n-type silicon substrate 32 remaining unaffected by this process (FIG. 19A).

In the above explanation, a p-type impurity was introduced into an n-type substrate, and the p-type diffusion region was selectively made porous. Alternatively, a p-type substrate may be made porous up to a depth of 50 μm by controlling porosity process time.

Next, a non-porous monocrystalline silicon epitaxial layer 33 was grown on the porous silicon layer 31 (FIG. 19B).

A thermal oxidation layer 34 of 5000 angstroms thick was then grown on top of the non-porous monocrystalline silicon layer 33 in a mixed gas of hydrogen and oxygen at 1100° C. for 50 minutes.

To enhance the its masking effect, an oxide film and a nitride film may be formed in a laminated structure.

By patterning the insulator layer 34 to a desired pattern, its surface was made uneven (FIG. 19C).

The porosity process already mentioned was again performed with the insulator layer 34 used as a masking material, allowing only exposed portions of the non-porous monocrystalline silicon layer 33, i.e., recess portions of the surface unevenness to become porous (FIG. 19D).

A silicon substrate 35 as a second substrate was bonded to the uneven surfaced insulator layer 34 of the first substrate. By heating in oxygen atmosphere at 1000° C. for 2 hours, both substrates were strongly bonded together (FIG. 19E).

The porous layer 31 was removed by etching process. As already mentioned, the etching rate of general monocrystalline silicon to a solution containing hydrofluoric acid, nitric acid and acetic acid (1:3:8) was about 1 micron/minute, while the etching rate of the porous layer was 100 times rapid. Specifically, the porous semiconductor layer 31 of 10 microns thick was removed within 10 seconds, and then silicon substrate 32 was also removed.

The monocrystalline silicon layer 33 of 0.5 μm thick was thus formed on the insulator layer 34 (FIG. 19F).

Figure 19G:
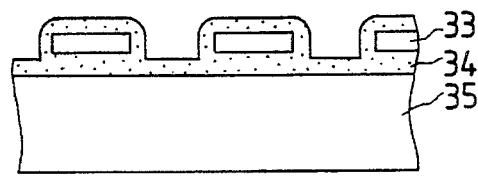

In FIG. 19G, oxidation was performed to isolate each island while removing the boundaries between the porous layer and the non-porous layer.

EXAMPLE 18

Although porosity was utilized to produce unevenness on the surface of a substrate in Example 17, another method proved feasible That method was the one in which unevenness was formed by dry etching silicon.

Figure 27A:
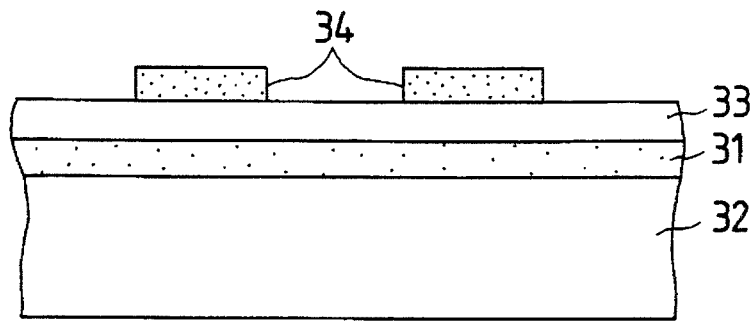
FIGS. 27A to 27C are schematic representations of the example 18 of the present invention.

In a similar manner to Example 17, a semiconductor substrate shown in FIG. 27A was produced. As an insulator layer 34 to be used as a masking material, oxide film was used. Instead of this, a nitride layer or resist may be used. In dry etching process, the selective ratio of the silicon layer/insulator layer is 10 times as large as or more than that of porous structure formation. Therefore, the thickness of the masking material can be made thinner.

Figure 27B:
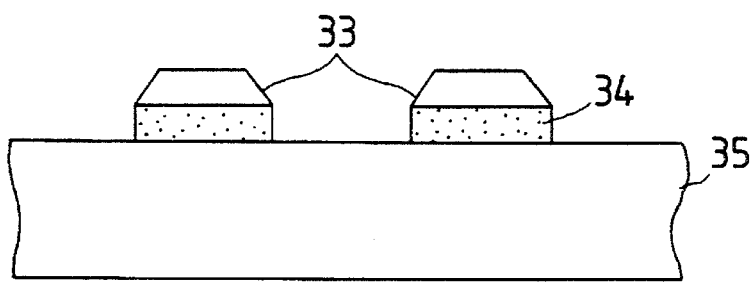
Figure 27C:
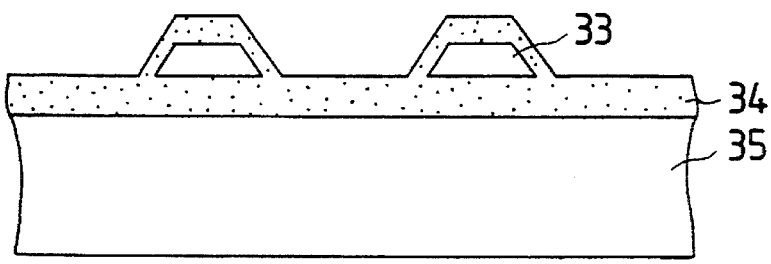
Figure 28A:
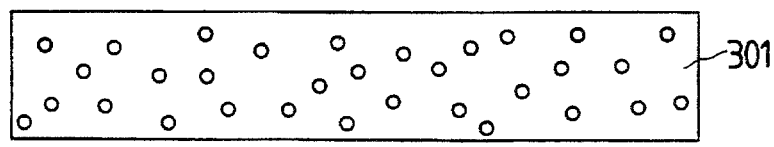
FIGS. 28A to 28E are schematic representations of the example 20 of the present invention.
Figure 28B:
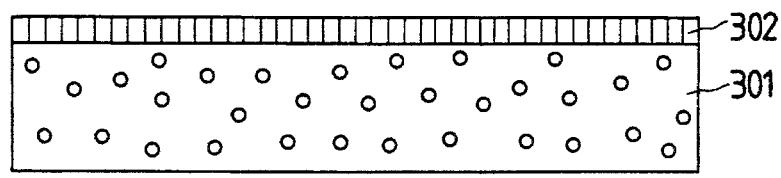
Figure 28C:
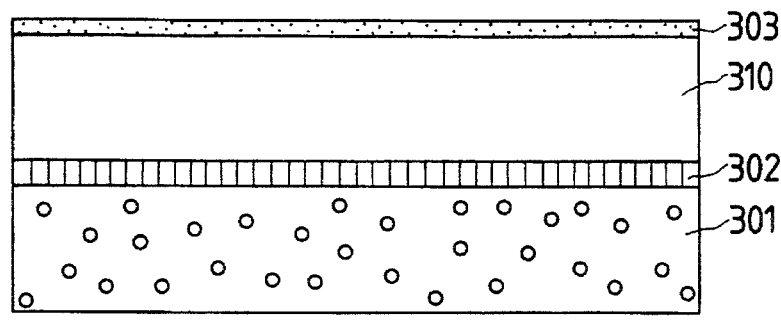
Figure 28D:
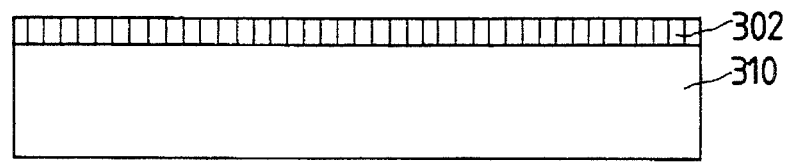
Figure 28E:
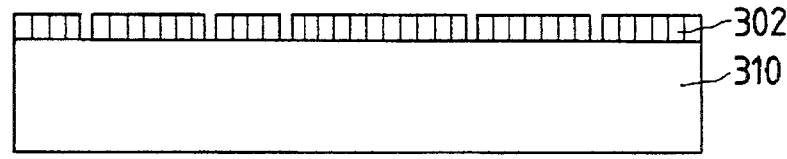
Figure 29A:
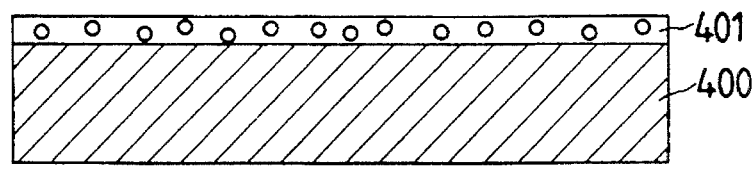
FIGS. 29A to 29E are schematic representations of the example 21 of the present invention.
Figure 29B:
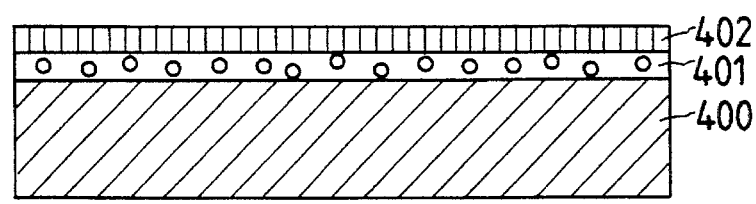
Figure 29C:
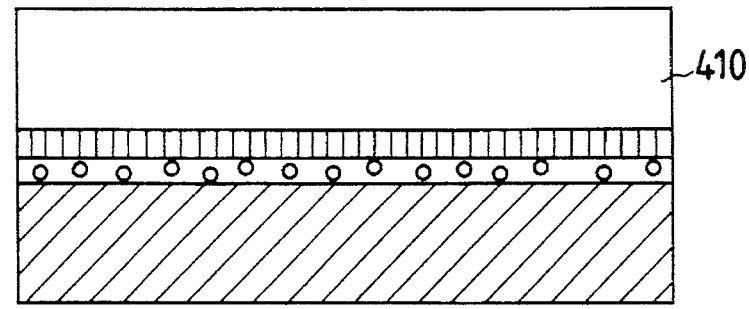
Figure 29D:
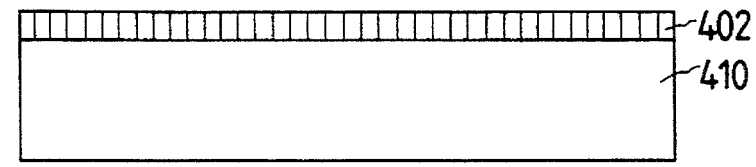
Figure 29E:
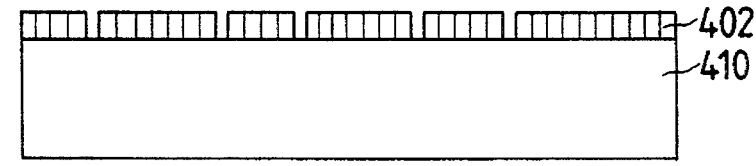
Figure 30A:
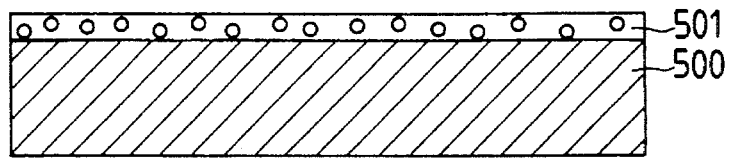
FIGS. 30A to 30E are schematic representations of the example 23 of the present invention.
Figure 30B:
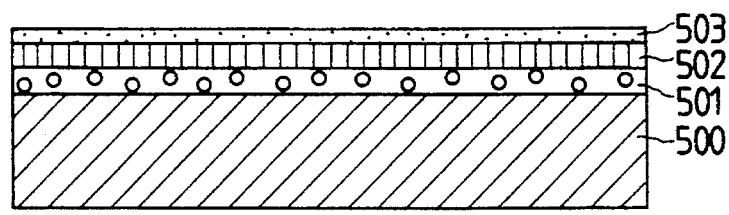
Figure 30C:
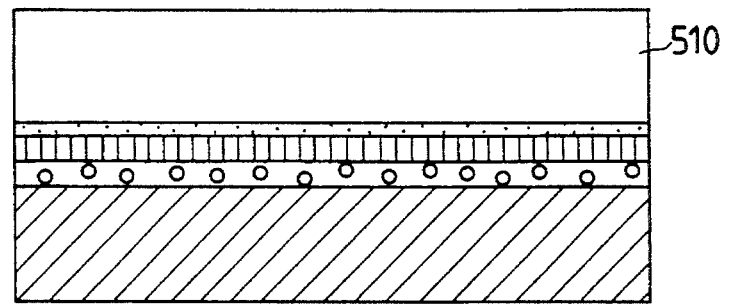
Figure 30D:
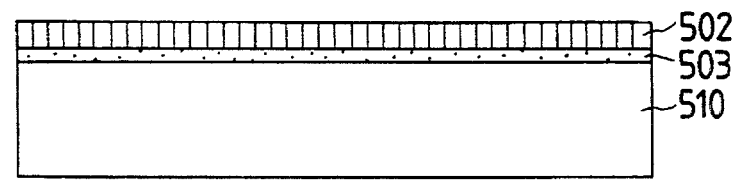
Figure 30E:
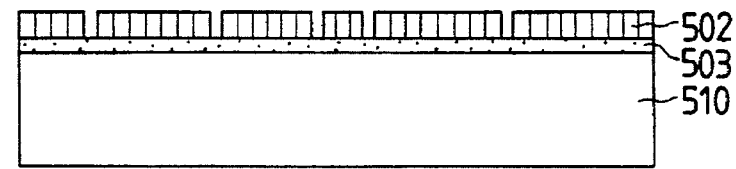

A semiconductor substrate shown in FIG. 27B was fabricated by dry etching using a $Cl_2$ based gas. Unlike the porosity method, the shape of the monocrystalline layer 33 may be flexibly changed by controlling input power, pressure, and the like. The semiconductor substrate was again oxidized, resulting in the semiconductor substrate shown in FIG. 27C.

To produce, on a insulator substrate, a silicon layer of which crystallinity is as excellent as that of monocrystalline wafer, examples 17 and 18 described in detail above offer a particularly excellent method from the standpoint of productivity, uniformity, controllability, and economy.

Unevenness formed on the bonding surface of the substrate particularly enhances the substrate bonding capability to the extent that a fabricated monocrystalline silicon layer is uniform and robust, but free from any defects such as void.

In the semiconductor substrate structure mentioned above, projected portions of unevenness may be flexibly formed wherever they are required for design, and then may be bonded. Recess portions of unevenness which are not bonded may be reserved for isolation region or for wiring region between semiconductor devices.

Furthermore, since the process mentioned above can be completed within a shortened time, productivity and economy factor in its industrial application can be substantially improved.

EXAMPLE 19

Referring now to FIG. 10 and FIG. 20, Example 19 of the present invention is described below.

Figure 20A:
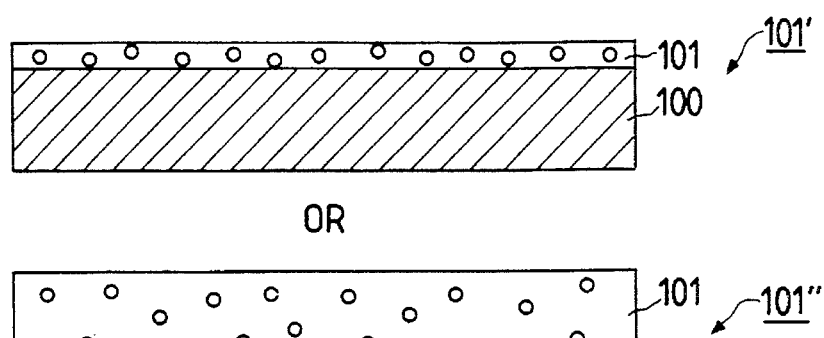
FIGS. 20A to 20E are schematic representations of processing steps for producing a semiconductor article according to the embodiment 6 of the present invention.
Figure 20B:
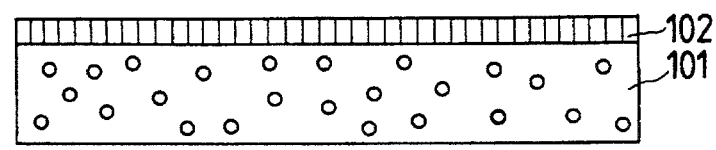
Figure 20C:
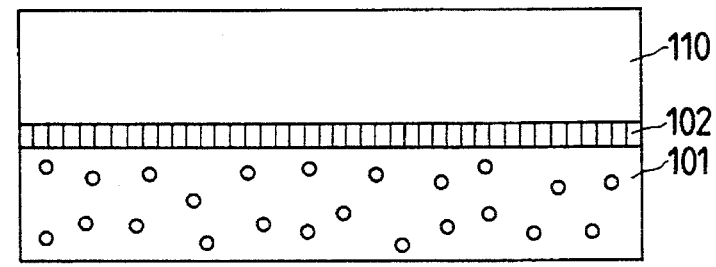
Figure 20D:
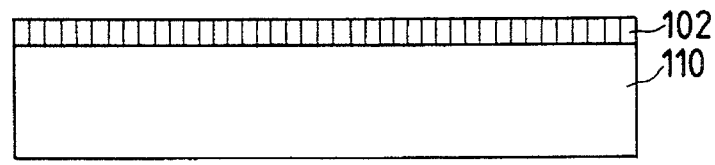
Figure 20E:
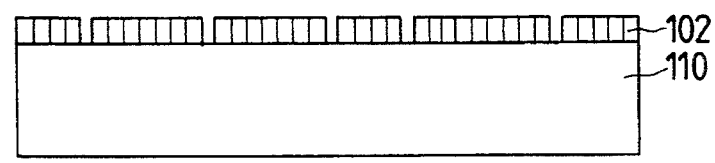

As in step shown in FIG. 20A, a 4-inch p-type (100) monocrystalline silicon substrate of 200μ thick (0.1–0.2 Ωcm) was prepared. The substrate was anodized in an apparatus shown in FIG. 10, and a porous silicon layer 101 was obtained. The solution 204 employed then was a 49% HF solution, and current density was 100 mA/cm². The porosity forming rate was 8.4 μm/minute, and the 200 μm thick p-type (100) silicon substrate entirely became porous within 24 minutes.

As in step B, using CVD method, a 1.0 μm monocrystalline silicon layer 102 was epitaxially grown on top of the p-type (100) porous silicon substrate 101. The conditions for deposition were as follows:

| | |
|---|---|
| gas: | $SiH_4/H_2$ |
| gas flow rate: | 0.62/140 (l/minute) |
| temperature: | 750° C. |
| pressure: | 80 Torr |
| growth rate: | 0.12 μm/minute |

The silicon substrate was washed in a mixed solution of hydrochloric acid, aqueous hydrogen peroxide, and water, and then was dried. As in step C, a 4-inch fused silica glass substrate 110 which was washed in a similar manner was bonded onto the silicon substrate at room temperature. The bonded substrates were then subjected to a first heat treatment at 150° C. in an oven for 20 minutes.

As in step D, the bonded substrates were dipped into a selective etching solution, allowing the porous portion 101 only to selectively be etched. The composition of the etching solution and the etching rate of the porous silicon are as follows:

$HF:H_2O_2:C_2H_5OH=5:25:6$ 1.6 μm/minute

Therefore, the entire porous portion of 200 μm thick was etched within about 125 minutes. For reference, the etching rate of the monocrystalline silicon layer 102 was 0.0006 μm/hour, and thus most of it was left unaffected by etching. Since the etching rate of the fused silica glass substrate 110 was 0.5 μm/minute, it was presumably etched by about 63 μm during the etching operation. The original thickness of the fused silica glass substrate was 525 μm, and its resulting thickness after etching was presumably about 462 μm.

As in step E, the entire area of the monocrystalline silicon thin layer 102 on the silica glass substrate 110 was patterned into islands, each 40×40 μm² square, with 2 μm crossing lines, using standard photolithographic and etching processes.

The patterning process was followed by a second heat treatment wherein the substrate was heated in nitrogen atmosphere at 1000° C. for 2 hours. Obtained as a result was an SOI substrate provided with a monocrystalline silicon thin film of 1 μm thick on the transparent substrate.

EXAMPLE 20

Referring now to FIG. 28, Example 20 of the present invention is described in detail below.

As in step A, a p-type (100) monocrystalline silicon substrate 300 of 200μ thick and of 0.01 Ωcm resistivity was prepared. The entire substrate was made porous in the same manner as in Example 19 to form the porous substrate 301.

As in step B, a 0.5 μm thick epitaxial layer 302 was grown onto one surface of the porous substrate in the same manner as in Example 19.

The silicon substrate was washed in a mixed solution of hydrochloric acid, aqueous hydrogen peroxide, and water, and then was dried. As in step C, a 4-inch fused silica glass substrate 310 which was washed in the same manner was bonded onto the silicon substrate at room temperature. As a protective film against the next selective etching process, a silicon nitride layer 303 of 0.3 μm thick was deposited onto the silica glass substrate 310 side of the bonded substrates, using enhanced plasma CVD. The deposition temperature of the silicon nitride film 303 was 300° C., and this process worked as a first heat treatment as well. In order to increase etching resistive characteristic against hydrofluoric acid, the nitride film 303 contains higher silicon content than the usual composition; the nitride film 303 has the ratio of S:N=3.7:4.

As in step D, in a similar etching manner to Example 19, the porous silicon portion 301 was selectively etched. The silicon nitride film 303 as the protective film disappeared almost at the same time the porous silicon 301 was completely etched, and the silica glass substrate 310 was etched by a few μm only.

As in step E, the monocrystalline silicon thin layer 302 obtained in step D on the silica glass substrate 310 was patterned into islands, which might match the area, shape, and layout of semiconductor device design. For example, a 4×10 μm² island including source and drain regions was patterned where a MOS transistor with 2 μm channel length and 4 μm channel width was designed.

The patterning process was followed by a second heat treatment wherein the substrate was heated in nitrogen atmosphere at 1000° C. for 2 hours. Obtained as a result was an SOI substrate provided with a monocrystalline silicon thin layer of 0.5 μm thick on the transparent substrate.

EXAMPLE 21

Referring now to FIG. 29, Example 21 of the present invention is described in detail below.

As in step A, a p-type (100) monocrystalline silicon substrate 400 of 400μ thick and of 0.01 Ωcm resistivity was prepared. A 20 μm thick porous layer 401 was formed on the surface of the substrate.

As in step B, a 0.5 μm thick epitaxial layer 402 was grown onto one surface of the porous surface of the substrate in a similar manner to Example 19.

The silicon substrate was washed in a mixed solution of hydrochloric acid, aqueous hydrogen peroxide, and water, and then was dried. As in step C, a 4-inch fused silica glass substrate 410 which was washed in a similar manner was bonded onto the silicon substrate at room temperature. In a first heat treatment, the bonded substrates were heated at 350° C. for 30 minutes in an oven.

As in step D, the silicon substrate 400 was entirely polished away in mechanical polishing, and the porous portion 401 was exposed. In a similar manner to Example 19, the porous silicon portion 401 was selectively etched. The thickness of the porous silicon layer 401 to be etched was 20 μm or so, and a 10 minute etching operation completed etching of the porous silicon layer 401. The silica glass substrate 410 practically remained unaffected by etching.

As in step E, in a similar manner to Example 20, the monocrystalline silicon thin layer 402 obtained on the silica glass substrate 410 was patterned into islands, which might match the area, shape, and layout of semiconductor device design.

The patterning process was followed by a second heat treatment wherein the substrate was heated in nitrogen atmosphere at 1000° C. for 2 hours. Obtained as a result was an SOI substrate provided with a monocrystalline silicon thin layer of 0.5 μm thick on the transparent substrate.

EXAMPLE 22

Referring now to FIG. 30, Example 22 of the present invention is described in detail below.

As in step A, a p-type (100) monocrystalline silicon substrate 500 of 400μ thick and of 0.01 Ωcm resistivity was prepared. A 20 μm thick porous layer 501 was formed on the surface of the substrate.

As in step B, a 0.5 μm thick epitaxial layer 502 was grown onto one surface of the porous surface of the substrate in a similar manner to Example 19. The epitaxial layer 502 of the substrate was oxidized by 0.2 μm from its surface in a 1000° C. vapor. As a result, the monocrystalline silicon epitaxial layer was 0.4 μm thick, and the oxide layer was 0.2 μm thick.

The silicon substrate was cleaned in a mixed solution of hydrochloric acid, aqueous hydrogen peroxide, and water, and then was dried. As in step C, a 4-inch fused silica glass substrate 510 which was cleaned in a similar manner was bonded onto the silicon substrate at room temperature. In a first heat treatment, the bonded substrates were heated at 350° C. for 30 minutes in an oven.

As in step D, the silicon substrate 500 was entirely polished away in mechanical polishing step and the porous portion 501 was exposed in a similar manner to Example 21.

As in step E, in a similar manner to Example 21, the monocrystalline silicon thin layer 502 obtained on the silica glass substrate 510 was patterned into islands, which might match the area, shape, and layout of semiconductor device design.

In a first device forming process in succession to the patterning process, each island region was oxidized by 0.05 μm in oxygen atmosphere at 1000° C. This oxidization process worked also as a second heat treatment. Obtained as a result was an SOI substrate provided with a monocrystalline silicon thin layer of 0.4 μm thick on the transparent substrate.

As detailed above, a monocrystalline layer epitaxially grown on a porous silicon layer is bonded to a transparent insulator substrate, the bonding strength of the interface between the substrates is enhanced slightly at a relatively low temperature in a first heat treatment, the porous layer is removed completely by means of polishing and etching, the resulting monocrystalline thin film is divided into islands, and the bonding strength of the interface is reinforced at a relatively high temperature in a second heat treatment; thus, an SOI substrate is fabricated in a manner which is free from the cracking and peeling of a layer and the warpage of a substrate, all of which are experienced in the conventional fabrication process in which conventional substrates having different coefficients of thermal expansion are bonded.

Furthermore, since the epitaxially grown layer is easily controlled in thickness distribution, the silicon layer thickness of an SOI resulting from the substrate bonding according to the present invention exhibits an excellent distribution. Since the SOI substrate according to the method of the present invention is of light-transmissive characteristic, a functional device which takes advantage of this characteristic can be fabricated.

What is claimed is:

1. A method for producing a semiconductor article, comprising, in sequence, the steps of:
   (i) preparing a first substrate having a non-porous semiconductor layer on a porous semiconductor region;
   (ii) forming unevenness on the surface at the side of said semiconductor layer of said first substrate;
   (iii) bonding the surface of said first substrate having said unevenness formed thereon to the surface of a second substrate so as to be in contact with each other; and
   (iv) removing said porous semiconductor such that said semiconductor layer is bonded to said second substrate to thereby transfer said semiconductor layer from said first substrate onto said second substrate.

2. The method according to claim 1, wherein said first substrate is prepared by converting a portion at the surface side of a substrate comprising the semiconductor into the porous region and then forming a monocrystalline semiconductor layer on the surface of said porous region.

3. The method according to claim 1, wherein said first substrate is prepared by forming a monocrystalline semiconductor layer on a substrate of porous semiconductor.

4. The method according to claim 1, wherein said first substrate is prepared by converting the portion other than the surface-side portion of a substrate of monocrystalline semiconductor into a porous member.

5. The method according to claim 1, wherein said first substrate has an insulating layer on the surface side of said semiconductor layer.

6. The method according to claim 1, wherein said second substrate has an insulating surface.

7. The method according to claim 1, wherein said second substrate has an insulating film provided thereon.

8. The method according to claim 1, wherein said second substrate is light-transmissive.

9. The method according to claim 1, wherein the step of removing said porous semiconductor is carried out by wet etching.

10. The method according to claim 1, wherein the step of removing said porous semiconductor includes a mechanical polishing step and a wet etching step.

11. The method according to any one of claims 1–10, wherein said semiconductor layer comprises silicon.

12. The method according to any one of claims 1–6 and 8–10, wherein said second substrate is made of quartz or glass.

13. The method according to any one of claims 1–6 and 8–10, wherein said semiconductor layer of said first substrate is made of silicon and said second substrate is made of quartz or glass.

14. The method according to any one of claims 1–7, 9, and 10, wherein said semiconductor layer of said first substrate is made of silicon, and said second substrate has an insulating layer formed on a silicon substrate.

15. The method according to any one of claims 1–10, wherein said porous semiconductor region is formed by anodization using a hydrofluoric acid solution.

16. The method according to any one of claims 1–10, wherein said semiconductor layer is a monocrystalline semiconductor formed by epitaxial growth.

17. The method according to any one of claims 1–10, wherein said semiconductor layer is a monocrystalline semiconductor as epitaxially grown by a method-selected from bias sputtering, molecular beam epitaxy, plasma-assisted CVD, photo-assisted CVD, and liquid phase epitaxy.

18. The method according to any one of claims 1–10, wherein the thickness of said semiconductor layer is not more than 100 µm.

19. The method according to any one of claims 1–10, wherein said unevenness includes a groove formed through said semiconductor layer and through said porous semiconductor region to reach an underlying region.

20. The method according to any one of claims 1–10, wherein said unevenness includes a groove formed through said semiconductor layer and through said porous semiconductor region to reach an underlying region, and the step of removing said porous semiconductor region includes the steps of polishing said underlying region until said groove is reached and then performing wet etching.

21. The method according to any one of claims 1–10, wherein said unevenness includes a groove formed through said semiconductor layer and through said porous semiconductor region to reach an underlying region, and the step of removing said porous semiconductor includes the steps of covering the back surface of said second substrate with an etching preventing film and then performing wet etching.

22. The method according to any one of claims 1–10, wherein said unevenness includes a groove formed through said semiconductor layer to reach at least a portion of said porous semiconductor region.

23. The method according to any one of claims 1–10, wherein said unevenness is formed with an insulating layer formed in a selected pattern on said semiconductor layer.

24. The method according to any one of claims, 1–10, wherein the step of bonding is carried out after steps of providing an insulating layer of a selected pattern on said semiconductor layer, forming said unevenness and then converting the exposed portion of said semiconductor layer thorough said insulating layer into an insulating material.

25. The method according to any one of claims 1–10, wherein said semiconductor layer comprises a plurality of island portions separated from each other.

26. The method according to any one of claims 1–10, further comprising the step of forming a semiconductor element using said transferred semiconductor layer.

27. A method for producing a semiconductor article, comprising the steps of:
   preparing a substrate having a non-porous semiconductor layer on a porous semiconductor region;
   bonding the surface at the side of said semiconductor layer to the surface of an insulating substrate so as to be in contact with each other;
   removing said porous semiconductor region under the state that said semiconductor layer is bonded to said insulating substrate to thereby transfer said semiconductor layer to said insulating substrate from said substrate;
   separating said transferred semiconductor layer into island regions; and
   heat treating said semiconductor layer separated into island regions on said insulating substrate.

28. The method according to claim 27, wherein said step of bonding includes a step of heat treatment at a temperature not higher than 600° C.

29. The method according to claim 27, wherein said substrate is prepared by converting a portion at the surface side of a substrate comprising the semiconductor into the porous region and then forming a monocrystalline semiconductor layer on the surface of said porous region.

30. The method according to claim 27, wherein said substrate is prepared by forming a monocrystalline semiconductor layer on a substrate of porous semiconductor.

31. The method according to claim 27, wherein said substrate is prepared by converting the portion other than the surface-side portion of a substrate of monocrystalline semiconductor into the porous region.

32. The method according to claim 27, wherein said substrate has an insulating layer on the surface side of said semiconductor layer.

33. The method according to claim 27, wherein said insulating substrate is light-transmissive.

34. The method according to claim 27, wherein the step of removing said porous semiconductor is carried out by wet etching.

35. The method according to claim 27, wherein the step of removing said porous semiconductor includes a mechanical polishing step and a wet etching step.

36. The method according to claim 27, wherein said semiconductor layer of said substrate is made of silicon and said second substrate is made of quartz or glass.

37. The method according to claim 27, wherein the thickness of said semiconductor layer is not more than 2 µm.

38. The method according to claim 27, further comprising the step of forming a semiconductor element in said island regions.

39. A method for producing a semiconductor article, comprising the steps of:

preparing a first substrate having a non-porous semiconductor layer on a porous semiconductor region;

separating said semiconductor layer into a plurality of island regions isolated with a dielectric region;

bonding the surface at the side of said plurality of island regions of said first substrate to the surface of a second substrate so as to be in contact with each other;

removing said porous semiconductor region under the state that said plurality of island regions are bonded to said second substrate to thereby transfer said plurality of island regions onto said second substrate.

40. The method according to claim 39, wherein said first substrate is prepared by converting a portion at the surface side of a substrate comprising the semiconductor into the porous region and then forming a monocrystalline semiconductor layer on the surface of said porous member.

41. The method according to claim 39, wherein said first substrate is prepared by forming a monocrystalline semiconductor layer on a substrate of porous semiconductor.

42. The method according to claim 39, wherein said first substrate is prepared by converting the portion other than the surface-side portion of a substrate of monocrystalline semiconductor into a porous member.

43. The method according to claim 39, wherein said first substrate has an insulating layer on the surface side of said semiconductor layer.

44. The method according to claim 39, wherein said second substrate has an insulating surface.

45. The method according to claim 39, wherein said second substrate has an insulating film provided thereon.

46. The method according to claim 39, wherein said second substrate is light-transmissive.

47. The method according to claim 39, wherein the step of removing said porous semiconductor is carried out by wet etching.

48. The method according to claim 39, wherein the step of removing said porous semiconductor includes a mechanical polishing step and a wet etching step.

49. The method according to claim 39, further comprising the step of forming a semiconductor element in said plurality of island regions.

50. A method for producing a semiconductor article, comprising the steps of:

preparing a first substrate having a non-porous semiconductor layer on a porous semiconductor region;

bonding the surface at the side of said semiconductor layer of said first substrate to a second substrate so as to be in contact with each other;

removing said porous semiconductor region under the state that said semiconductor layer is bonded to said second substrate to thereby transfer said semiconductor layer onto said second substrate from said first substrate; and separating said semiconductor layer into a plurality of island regions before or after said step of bonding.

51. The method according to claim 28, wherein the temperature in said heat treating step is higher than that in the heat treatment in said bonding step.

52. The method according to claim 51, wherein the temperature in said heat treating step is 800° C. or higher.

* * * * *

UNITED STATES PATENT AND TRADEMARK OFFICE
CERTIFICATE OF CORRECTION

PATENT NO. : 5,466,631

DATED : November 14, 1995

INVENTOR(S) : TAKESHI ICHIKAWA ET AL.

Page 1 of 7

It is certified that error appears in the above-identified patent and that said Letters Patent is hereby corrected as shown below:

On title page, item [56]

REFERENCES CITED

Foreign Patent Documents, "2267949" should read --2-267949--.

Foreign Patent Documents, "3109731" should read --3-109731--.

COLUMN 1

Line 58, "area" should read --are a--.

COLUMN 2

Line 20, "is" should read --is melted--.

Line 41, "oxide;" should read --oxide--.

COLUMN 4

Line 18, "avoided to" should be deleted.

Line 19, "be" should be deleted.

UNITED STATES PATENT AND TRADEMARK OFFICE
CERTIFICATE OF CORRECTION

PATENT NO.  : 5,466,631
DATED       : November 14, 1995
INVENTOR(S) : TAKESHI ICHIKAWA ET AL.

It is certified that error appears in the above-identified patent and that said Letters Patent is hereby corrected as shown below:

<u>COLUMN 5</u>

Line 26, "exist" should read --exists--.

Line 55, "are" should read --is--.

Line 64, "further" should read --a further--.

<u>COLUMN 11</u>

Line 66, "a" should read --as--.

<u>COLUMN 13</u>

Line 26, "an" should read --a--.

<u>COLUMN 14</u>

Line 33, "small enough" should read --sufficiently small--.

<u>COLUMN 16</u>

Line 50, "short" should read --a short--.

UNITED STATES PATENT AND TRADEMARK OFFICE
CERTIFICATE OF CORRECTION

PATENT NO. : 5,466,631

DATED : November 14, 1995

INVENTOR(S): TAKESHI ICHIKAWA ET AL.

It is certified that error appears in the above-identified patent and that said Letters Patent is hereby corrected as shown below:

COLUMN 18

Line 53, "insulating" should read --insulatedly--.

COLUMN 19

Line 39, "expitaxial" should read --epitaxial--.

Line 50, "was" should read --were--.

COLUMN 20

Line 37, "expitaxial" should read --epitaxial--.

Line 48, "On" should read --on--.

COLUMN 21

Line 7, "result" should read --result,--.

Line 36, "expitaxial" should read --epitaxial--.

COLUMN 22

Line 34, "expitaxial" should read --epitaxial--.

UNITED STATES PATENT AND TRADEMARK OFFICE
CERTIFICATE OF CORRECTION

PATENT NO. : 5,466,631

DATED : November 14, 1995

INVENTOR(S): TAKESHI ICHIKAWA ET AL.

It is certified that error appears in the above-identified patent and that said Letters Patent is hereby corrected as shown below:

COLUMN 23

Line 31, "expitaxial" should read --epitaxial--.

COLUMN 24

Line 29, "expitaxial" should read --epitaxial--.

Line 51, "4.5" should read --4.5%-- and close up right margin.

Line 52, Close up left margin.

COLUMN 25

Line 26, "expitaxial" should read --epitaxial--.

COLUMN 26

Line 23, "expitaxial" should read --epitaxial--.

COLUMN 27

Line 55, "expitaxial" should read --epitaxial--

UNITED STATES PATENT AND TRADEMARK OFFICE
CERTIFICATE OF CORRECTION

PATENT NO. : 5,466,631

DATED : November 14, 1995

INVENTOR(S): TAKESHI ICHIKAWA ET AL.

It is certified that error appears in the above-identified patent and that said Letters Patent is hereby corrected as shown below:

COLUMN 28

Line 4, "a" should read --an--.

Line 61, "expitaxial" should read --epitaxial--.

COLUMN 29

Line 7, "mothod," should read --method,--.

Line 25, "Fate" should read --rate--.

Line 65, "expitaxial" should read --epitaxial--.

COLUMN 31

Line 2, "expitaxial" should read --epitaxial--.

COLUMN 32

Line 7, "1 x $10^{-2}$ Torr" should read --1 x $10^{-2}$ Torr--.

Line 11, "expitaxial" should read --epitaxial--.

Line 46, "removed," should read --was removed,--.

UNITED STATES PATENT AND TRADEMARK OFFICE
CERTIFICATE OF CORRECTION

PATENT NO. : 5,466,631

DATED : November 14, 1995

INVENTOR(S) : TAKESHI ICHIKAWA ET AL.

It is certified that error appears in the above-identified patent and that said Letters Patent is hereby corrected as shown below:

COLUMN 33

Line 15, "expitaxial" should read --epitaxial--.

Line 51, "removed," should read --was removed,--.

COLUMN 34

Line 18, "expitaxial" should read --epitaxial--.

Line 56, "removed," should read --was removed,--.

COLUMN 35

Line 19, "Source" should read --source--.

Line 24, "expitaxial" should read --epitaxial--.

Line 61, "removed," should read --was removed,--.

COLUMN 36

Line 31, "19E," should read --19G,--.

Line 55, "the its" should read --its--.

UNITED STATES PATENT AND TRADEMARK OFFICE
CERTIFICATE OF CORRECTION

PATENT NO. : 5,466,631

DATED : November 14, 1995

INVENTOR(S) : TAKESHI ICHIKAWA ET AL.

Page 7 of 7

It is certified that error appears in the above-identified patent and that said Letters Patent is hereby corrected as shown below:

COLUMN 37

Line 7, "rapid." should read --more rapid.--

Line 20, "feasible" should read --feasible.--.

Line 41, "examples 17" should read --Examples 17--.

COLUMN 41

Line 63, "method-selected" should read --method selected--.

Signed and Sealed this

Twenty-sixth Day of March, 1996

Attest:

BRUCE LEHMAN

Attesting Officer

Commissioner of Patents and Trademarks